(12) United States Patent  
Choi et al.

(10) Patent No.: US 12,463,189 B2  
(45) Date of Patent: Nov. 4, 2025

(54) DISPLAY DEVICE

(71) Applicant: Samsung Display Co., LTD., Yongin-si (KR)

(72) Inventors: Hae Yun Choi, Hwaseong-si (KR); Min Woo Kim, Hwaseong-si (KR); Sung Kook Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 762 days.

(21) Appl. No.: 17/751,449

(22) Filed: May 23, 2022

(65) Prior Publication Data

US 2023/0047445 A1 Feb. 16, 2023

(30) Foreign Application Priority Data

Aug. 9, 2021 (KR) .................. 10-2021-0104520  
Dec. 21, 2021 (KR) .................. 10-2021-0183398

(51) Int. Cl.  
*H01L 25/16* (2023.01)  
*G09G 3/20* (2006.01)  
*H10H 20/852* (2025.01)  
*H10H 20/855* (2025.01)

(52) U.S. Cl.  
CPC ......... *H01L 25/167* (2013.01); *H10H 20/852* (2025.01); *H10H 20/855* (2025.01); *G09G 3/20* (2013.01); *G09G 2300/0426* (2013.01); *G09G 2300/0452* (2013.01); *G09G 2300/0809* (2013.01)

(58) Field of Classification Search  
CPC . H01L 25/167; H01L 25/0753; H10H 20/852; H10H 20/855; G09G 3/32; H10K 59/122; H10K 59/879; H10K 59/8792  
See application file for complete search history.

(56) References Cited

U.S. PATENT DOCUMENTS

| | | | |
|---|---|---|---|
| 11,106,882 B2 | 8/2021 | Jung et al. | |
| 11,443,683 B2 | 9/2022 | Kim et al. | |
| 2017/0351365 A1* | 12/2017 | Sasaki | G06F 3/0443 |
| 2020/0358036 A1* | 11/2020 | Yokoyama | H10K 59/879 |
| 2020/0365833 A1 | 11/2020 | Joo et al. | |

(Continued)

FOREIGN PATENT DOCUMENTS

| | | |
|---|---|---|
| KR | 10-2015-0019325 A | 2/2015 |
| KR | 10-2018-0060816 A | 6/2018 |

(Continued)

OTHER PUBLICATIONS

Korean Office Action for KR Application No. 10-2021-0183398, dated Feb. 6, 2025, 10 pages.

*Primary Examiner* — Julia Slutsker  
(74) *Attorney, Agent, or Firm* — Womble Bond Dickinson (US) LLP

(57) ABSTRACT

A display device includes a partition wall on a substrate, a plurality of light emitting elements respectively located on a plurality of emission areas defined by the partition wall, the plurality of light emitting elements extend in a thickness direction of the substrate, a base resin located in the plurality of emission areas, and a plurality of optical patterns located on at least one of the plurality of emission areas, wherein the plurality of emission areas are arranged in a RGBG matrix pattern by the partition wall.

20 Claims, 35 Drawing Sheets

(56) References Cited

U.S. PATENT DOCUMENTS

2021/0151422 A1\* 5/2021 Iguchi .................. H01L 25/167
2021/0376286 A1\* 12/2021 Fujimaki .............. H10K 50/865

FOREIGN PATENT DOCUMENTS

| KR | 10-2018-0118488 A | 10/2018 |
| --- | --- | --- |
| KR | 10-2019-0001229 A | 1/2019 |
| KR | 20190098874 A | 8/2019 |
| KR | 10-2020-0075597 A | 6/2020 |
| KR | 10-2021-0009326 A | 1/2021 |
| KR | 20210002171 A | 1/2021 |
| KR | 20210012181 A | 2/2021 |

\* cited by examiner

EA4(G)=EA3(G)<EA2(B)<EA1(R)

(a)

(b)

(c)

(d)

(e)

DISPLAY DEVICE

CROSS-REFERENCE TO RELATED APPLICATION

This application claims priority to and the benefit of Korean Patent Application No. 10-2021-0104520 filed on Aug. 9, 2021 and Korean Patent Application No. 10-2021-0183398 filed on Dec. 21, 2021 in the Korean Intellectual Property Office, the entire contents of all of which are incorporated by reference herein.

BACKGROUND

1. Field

The present disclosure relates to a display device.

2. Description of the Related Arts

With the advancement of the information society, the demand for display devices for displaying images is increasing in various forms. Examples of display devices include flat panel display devices such as a liquid crystal display (LCD) device, a field emission display (FED) device, a light-emitting display device, and the like.

A light-emitting display device may be an organic light emitting display device including an organic light emitting diode element as a light emitting element, an inorganic light emitting display device including an inorganic semiconductor element as a light emitting element, or a light emitting diode (LED) display device including a subminiature light-emitting diode element (or a micro light emitting diode element) as a light-emitting element.

Recently, head mounted displays (HMD) for realizing virtual reality (VR) or augmented reality (AR) have been developed. An LED display device to which a subminiature LED element is applied may be applied to the HMD.

SUMMARY

One or more embodiments of the present disclosure provide a display device capable of improving the light emitting efficiency of subminiature light emitting didoes according to the emission color of the subminiature light emitting didoes.

However, aspects of the present disclosure are not limited to those set forth herein. The above and other aspects of the present disclosure will become more apparent to one of ordinary skill in the art to which the present disclosure pertains by referencing the detailed description of the present disclosure given below.

According to one or more embodiments of the present disclosure, a display device includes a partition wall on a substrate; a plurality of light emitting elements respectively located on a plurality of emission areas defined by the partition wall, the plurality of light emitting elements extend in a thickness direction of the substrate; a base resin located in the plurality of emission areas; and a plurality of optical patterns located on at least one of the plurality of emission areas, wherein the plurality of emission areas are arranged in a RGBG matrix pattern by the partition wall.

In one or more embodiments, the display device further includes a light blocking member on the partition wall; and a filling member covering all of the plurality of emission areas and the plurality of optical patterns located on at least one emission area of the plurality of emission areas, wherein a refractive index of the filling member is greater than a refractive index of the base resin or the plurality of optical patterns.

In one or more embodiments, the display device further includes a light blocking member on the partition wall; and an adhesive member covering all of the plurality of emission areas as well as the plurality of optical patterns included in the at least one emission area, wherein a refractive index of the adhesive member is smaller than a refractive index of the base resin or the plurality of optical patterns.

In one or more embodiments, the plurality of emission areas comprises first to third emission areas, or first to fourth emission areas, that are arranged in the RGBG matrix pattern in each pixel area, from among the first to fourth emission areas, the first emission area comprises a first light emitting element configured to emit a first light in a wavelength range realizing any one of red, green, and blue colors, the second emission area comprises a second light emitting element configured to emit a second light in a wavelength range realizing one of red, green, and blue colors, which is different from a color of the first light; the third emission area comprises a third light emitting element configured to emit a third light in a wavelength range realizing one of red, green, and blue colors, which is different from colors of the first light and the second light; and the fourth emission area comprises a fourth light emitting element configured to emit a fourth light in the same wavelength range as that of any one of the first to third lights.

In one or more embodiments, the first to fourth emission areas have the same size or planar area as each other, a distance between the first emission area and the second emission area adjacent to each other in a horizontal direction or in a diagonal direction, a distance between the second emission area and the third emission area, a distance between the first emission area and the third emission area, and a distance between the third emission area and the fourth emission area are equal to one another according to a size or planar area of each of the first to fourth emission areas.

In one or more embodiments, sizes or planar areas of the first to fourth emission areas are different from one another, and a distance between the first emission area and the second emission area adjacent to each other in a horizontal direction or in a diagonal direction, a distance between the second emission area and the third emission area, a distance between the first emission area and the third emission area, and a distance between the third emission area and the fourth emission area are the same as or different from one another according to the sizes or planar areas of the first to fourth emission areas.

In one or more embodiments, the plurality of optical patterns are the same as or larger than the planar area of each of the first to fourth emission areas so as to fully cover the respective first to fourth emission area.

In one or more embodiments, the plurality of optical patterns are smaller than the planar area of each of the plurality of emission areas, where the first to fourth light emitting elements are located at the first to fourth emission areas, respectively.

In one or more embodiments, a height or length of the partition wall is the same as a height or length of the plurality of light emitting elements.

According to one or more embodiments of the present disclosure, a display device includes a partition wall in a display area of a substrate and defining first to fourth emission areas in a RGBG matrix pattern in each of pixel areas; first to fourth light emitting elements respectively located in the first to fourth emission areas; a plurality of optical patterns located on the first to fourth emission areas respectively comprising the first to fourth light emitting elements, wherein sizes or planar areas of the first to fourth emission areas are the same as or different from one another.

In one or more embodiments, the first light emitting element of the first emission area is configured to emit a first light in a wavelength range realizing any one of red, green, and blue colors, the second light emitting element of the second emission area is configured to emit a second light in a wavelength range realizing one of red, blue, and green colors, which is different from a color of the first light, the third light emitting element of the third emission area is configured to emit a third light in a wavelength range realizing one of red, blue, and green colors, which is different from colors of the first light and the second light, and the fourth light emitting element of the fourth emission area is configured to emit a fourth light in a wavelength range realizing the same color as the color of any one of the first to third lights.

In one or more embodiments, the first and second emission areas in each of the pixel areas are alternately arranged in odd-numbered rows along a first direction that is a horizontal (or row) direction, the third and fourth emission areas are alternately arranged in even-numbered rows along the first direction, the first and third emission areas are alternately arranged along a first diagonal direction, and the second and fourth emission areas are alternately arranged along the first diagonal direction.

In one or more embodiments, the first and second emission areas located adjacent to each other, the third and fourth emission areas, the first and third emission areas, and the second and fourth emission areas have the same size or planar area as each other, a distance between the first emission area and the second emission area adjacent to each other in the horizontal direction or in the first diagonal direction, a distance between the second emission area and the third emission area, a distance between the first emission area and the third emission area, and a distance between the third emission area and the fourth emission area are equal to one another.

In one or more embodiments, the first and second emission areas located adjacent to each other, the third and fourth emission areas, the first and third emission areas, and the second and fourth emission areas have the same or different size or planar area from each other, and a distance between the first emission area and the second emission area adjacent to each other in the horizontal direction or in the first diagonal direction, a distance between the second emission area and the third emission area, a distance between the first emission are and the third emission area, and a distance between the third emission area and the fourth emission area are the same as or different from one another according to the sizes or planar areas of the first to fourth emission areas.

In one or more embodiments, the first to fourth emission areas in each of the pixel areas, a size or area of the first emission area is greater than the size or area of the adjacent second emission area, the size or area of the second emission area is greater than the size or area of the adjacent third emission area, and the third and fourth emission areas adjacent to each other have the same size or area as each other, and a size or planar area of the first light emitting element is greater than a size or planar area of the second light emitting element corresponding to the areas or sizes of the first to fourth emission areas, the size or planar area of the second light emitting element is greater than the size or planar area of the third light emitting element, and the third and fourth emission areas have the same size or planar area as each other.

In one or more embodiments, a size or area of an optical pattern on the first emission area is greater than a size or area of an optical pattern on the second emission area, the size or area of the optical pattern on the second emission area is greater than sizes or areas of optical patterns on the third and fourth emission areas, and the sizes or areas of the optical patterns on the third and fourth emission areas are the same as each other.

In one or more embodiments, among the first to fourth emission areas in each of the pixel areas: a size or area of the first emission area is greater than a size or area of the adjacent second emission area, the size or area of the second emission area is greater than a size or planar area of the adjacent third emission area, and the size or area of the third emission area is greater than a size or area of the adjacent fourth emission area.

In one or more embodiment, a size or planar area of the first light emitting element is greater than a size or planar area of the second light emitting element corresponding to the area or size of each of the first to fourth emission areas, the size or planar area of the second light emitting element is greater than a size or planar area of the third light emitting element, and the size or planar area of the third light emitting element is greater than a size or planar area of the fourth light emitting element.

In one or more embodiments, among the first to fourth emission areas in each of the pixel areas: a size or area of the first emission area is greater than a size or area of the second emission area and a sizes or areas of the second to fourth emission areas are the same as one another, a size or planar area of the first light emitting element is greater than a size or planar area of the second light emitting element corresponding to areas or sizes of the first to fourth emission areas, and sizes or areas of the second to fourth light emitting elements are the same as one another.

In one or more embodiments, the first light emitting element is configured to emit a first light in a wavelength range realizing any one of red, green, and blue colors, the second light emitting element is configured to emit a second light in a wavelength range realizing one of red, blue, and green colors, which is different from a color of the first light, the third light emitting element is configured to emit a third light in a wavelength range realizing one of red, blue, and green colors, which is different from a colors of the first light and the second light, and the fourth light emitting element is configured to emit a fourth light in a wavelength range realizing the same color as the color of any one of the first to third lights.

According to embodiments of the present disclosure, the display device may improve emission efficiency of subminiature light emitting diodes.

It should be noted that the effects of the present disclosure are not limited to those described above, and other effects of the present disclosure will be apparent from the following description.

BRIEF DESCRIPTION OF THE DRAWINGS

The above and other aspects and features of the embodiments of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the attached drawings.

Figure 1:
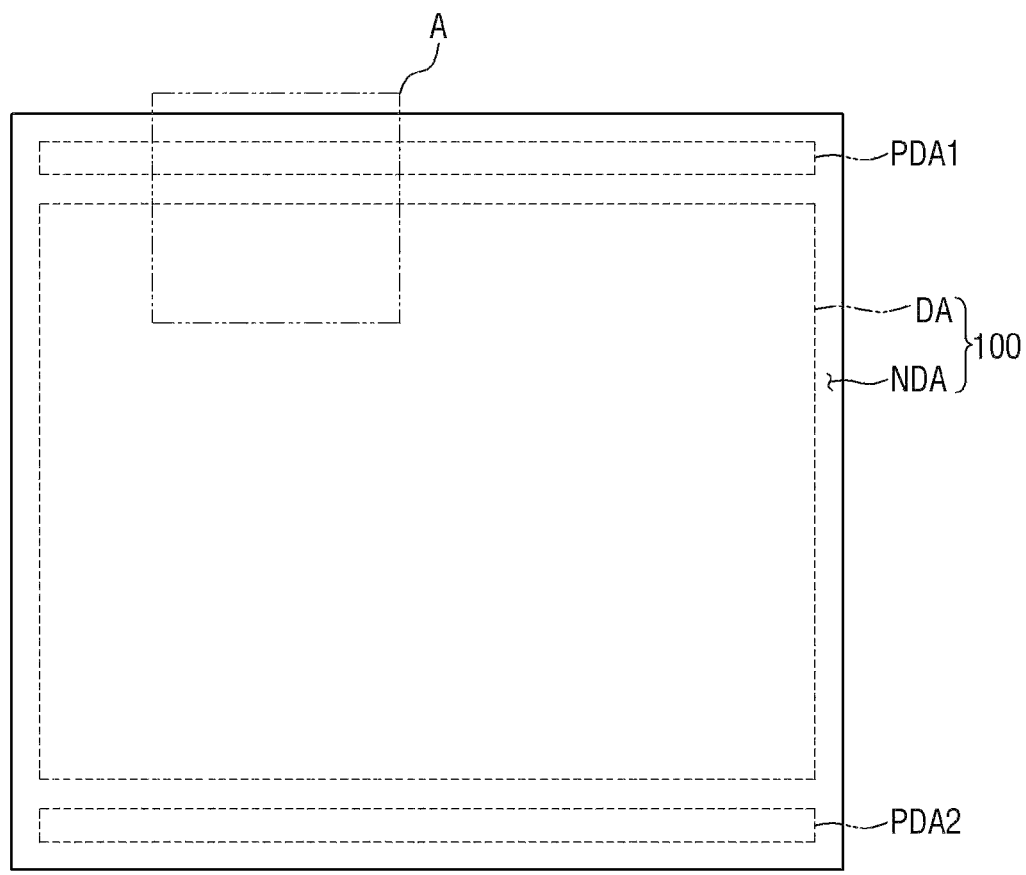
FIG. 1 is a layout view of a display device according to one or more embodiments of the present disclosure.
Figure 1:
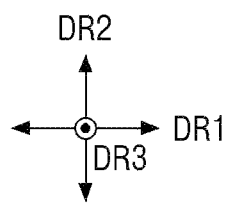

FIG. 1 is a layout view illustrating a display device according to one or more embodiments of the present disclosure. In addition, FIG. 2 is a layout view illustrating in detail an area A of FIG. 1, and FIG. 3 is a layout view illustrating pixels illustrated in an area B of FIG. 2 in detail.

Figure 2:
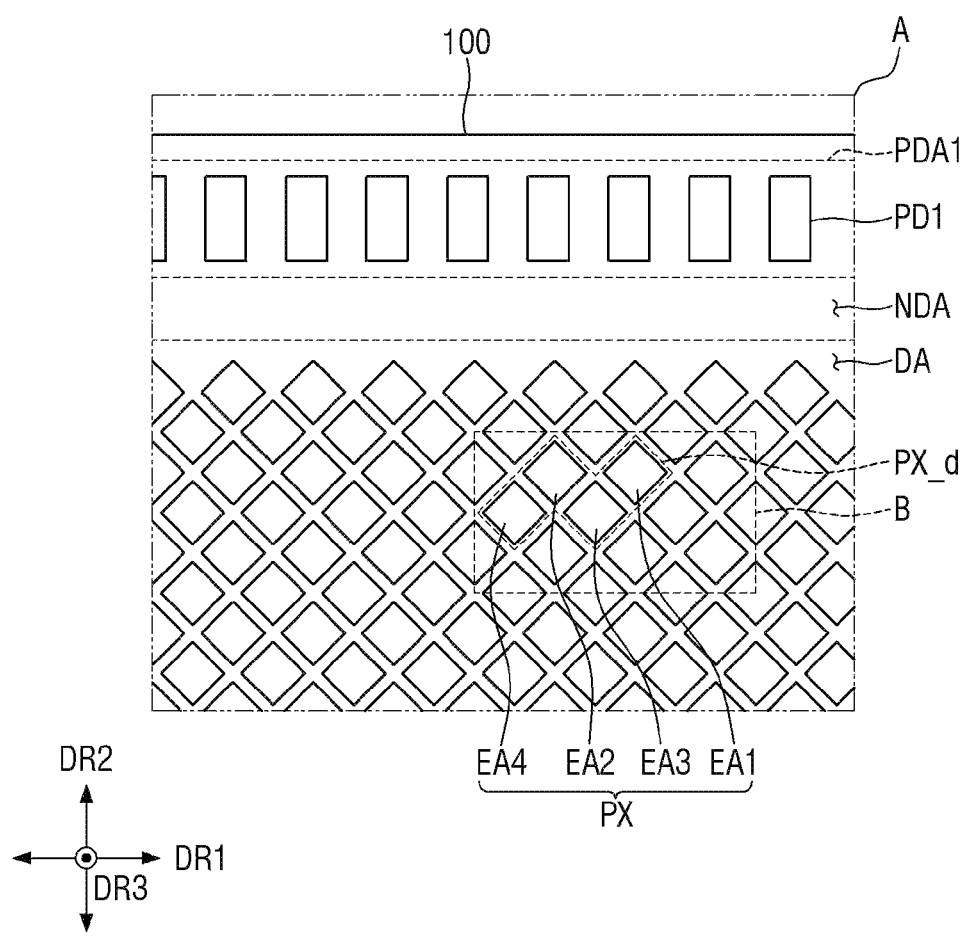
FIG. 2 is a layout view illustrating in detail an area A of FIG. 1.
Figure 3:
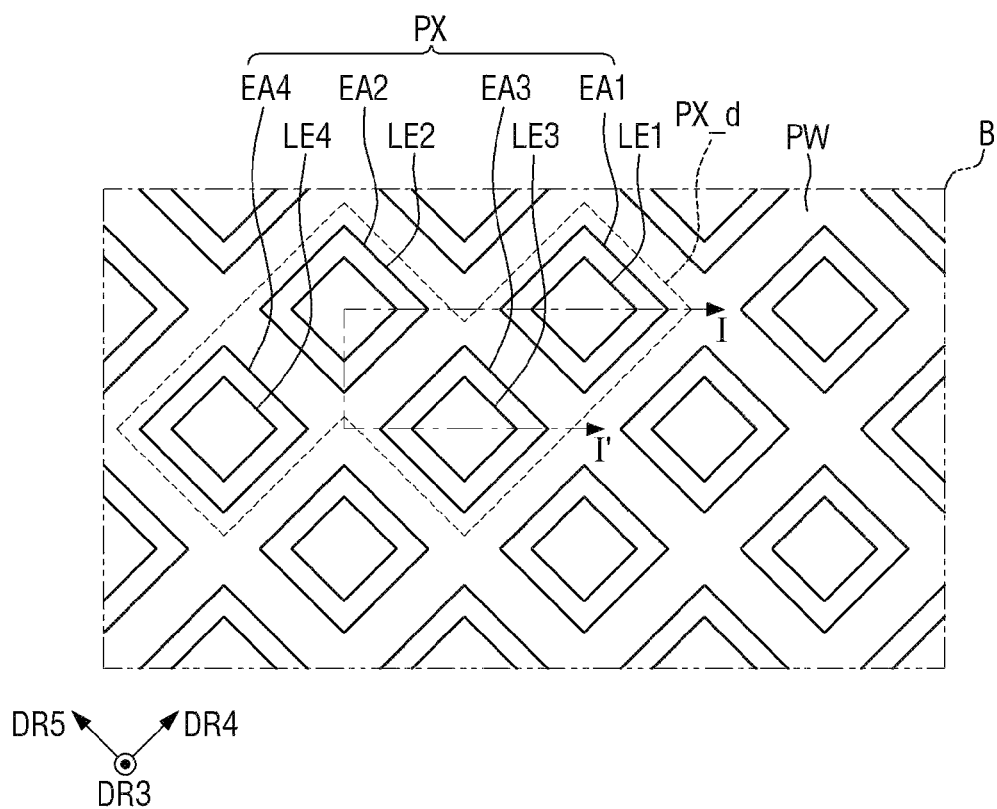
FIG. 3 is a layout view illustrating in detail pixels shown in an area B of FIG. 2.

A light emitting diode on silicon (LEDoS) structure in which light emitting diodes are disposed on a semiconductor circuit board formed by a semiconductor process is described as an example of the display device according to the embodiment of FIGS. 1 to 3. However, it should be noted that embodiments of the present specification are not limited thereto.

In addition, the display device according to one or more embodiments of the present disclosure may be a subminiature light emitting diode display device (micro or nano light emitting diode display device) including a subminiature light emitting diode (micro or nano light emitting diode) as a light emitting element, but embodiments of the present disclosure are not limited thereto.

Referring to FIGS. 1 to 3, a first direction DR1 refers to a horizontal direction of a display panel 100, a second direction DR2 refers to a vertical direction of the display panel 100, and a third direction DR3 refers to a thickness direction of the display panel 100 or a thickness direction of a semiconductor circuit board 110. In addition, a fourth direction DR4 refers to a diagonal direction of the display panel 100, and a fifth direction DR5 refers to a diagonal direction intersecting the fourth direction DR4. Also, the terms "left", "right", "upper", and "lower", as used herein, denote corresponding directions as viewed from above the display panel 100. For example, the term "right side" denotes one side in the first direction DR1, the term "left side" denotes the other side in the first direction DR1, the term "upper side" denotes one side in the second direction DR2, and the term "lower side" denotes the other side in the second direction DR2. Also, the term "upper portion" denotes one side in the third direction DR3, and the term "lower portion" denotes the other side in the third direction DR3.

Referring to FIGS. 1 to 3, the display device 10 according to one or more embodiments may include a display panel 100 that includes a display area DA and a non-display area NDA.

The display panel 100 may have a rectangular shape in a plan view having long sides in the first direction DR1 and short sides in the second direction DR2. The planar shape of the display panel 100 is not limited to a rectangular shape, and may have a polygonal shape other than a rectangle, a circular shape, an elliptical shape, or an irregular planar shape.

The display area DA may be an area where an image can be displayed, and the non-display area NDA may be an area where no image is displayed. The planar shape of the display area DA may follow the planar shape of the display panel 100. In FIG. 1, the planar shape of the display area DA is a rectangle. The display area DA may be disposed in a center portion of the display panel 100. The non-display area NDA may be disposed outside the display area DA. The non-display area NDA may be disposed in such a way so as to enclose the display area DA or surround the display area along the edge or periphery of the display area DA.

The display area DA of the display panel 100 may include a plurality of pixels PX. Each of the pixels PX may be defined as the smallest light emitting unit allowing white color light to be displayed in each defined pixel area PX_d.

The pixels PX disposed as the smallest units allowing white color light to be displayed in each pixel area PX_d may include a plurality of emission areas EA1, EA2, EA3, and EA4. In the described embodiment of the present disclosure, each pixel PX may include four emission areas EA1, EA2, EA3, and EA4 arranged in a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. For example, in one or more embodiments, each of the plurality of pixels PX may include only three emission areas EA1, EA2, and EA3.

Among the plurality of emission areas EA1, EA2, EA3, and EA4, a first emission area EA1 may include a first light emitting element LE1 configured to emit a first light, a second emission area EA2 may include a second light emitting element LE2 configured to emit a second light, a third emission area EA3 may include a third light emitting element LE3 configured to emit a third light, and a fourth emission area EA4 may include a fourth light emitting element LE4 configured to emit a fourth light. The first light may be light in a wavelength range realizing one of red, green, and blue colors. The second light may be light in a wavelength range realizing one of red, green, and blue colors, which is different from the color of the first light. The third light may be light in a wavelength range realizing one of red, green, and blue colors, which is different from the colors of the first light and the second light. In addition, the fourth light may be light in the same wavelength range as that of one of the first to third lights.

Each of the first to fourth light emitting elements LE1 to LE4 respectively included in the first to fourth emission areas EA1 to EA4 arranged in a Pentile® (e.g. RGBG) matrix form may have a rhombic shape in a plan view, but embodiments of the present disclosure are not limited thereto. For example, each of the first to fourth light emitting elements LE1 to LE4 may be formed in a polygonal shape, such as a triangle or a quadrilateral, other than a rhombus shape, a circular shape, an elliptical shape, or an irregular shape.

Each of the first emission areas EA1 refers to an area where the first light is emitted. Each of the first emission areas EA1 may output the first light output by the first light emitting element LE1 intact. As described above, the first light may be light in a wavelength range realizing one of red, green, and blue colors. For example, the first light may be light in the red wavelength range. The red wavelength range may be approximately 600 nm to 750 nm, but embodiments of the present disclosure are not limited thereto.

Each of the second emission areas EA2 may refer to an area where the second light is emitted. Each of the second emission areas EA2 may output the second light output by the second light emitting element LE2 intact. The second light may be light in a wavelength range realizing one of red, blue, and green colors, which is different from the color of the first light. For example, the second light may be light in the blue wavelength range. The blue wavelength range may be approximately 370 nm to 460 nm, but embodiments of the present disclosure are not limited thereto.

Each of the third emission areas EA3 refers to an area where the third light is emitted. Each of the third emission areas EA3 may output the third light output by the third light emitting element LE3 intact. The third light may be light in a wavelength range realizing one of red, blue, and green colors, which is different from the colors of the first light and the second light. For example, the third light may be light in the green wavelength range. The green wavelength range may be approximately 480 nm to 560 nm, but embodiments of the present disclosure are not limited thereto.

Each of the fourth emission areas EA4 may refer to an area where the fourth light is emitted. Each of the fourth emission areas EA4 may output the fourth light output by the fourth light emitting element LE4 intact. Here, the fourth light may be light in a wavelength range realizing the same color as that of one of the first to third lights. For example, the fourth light may be light in the same blue wavelength range as the second light, and the third light may be light in the same green wavelength range as the third light. Embodiments of the present disclosure are not limited thereto.

The first emission areas EA1 and the second emission areas EA2 may be alternately arranged in odd-numbered rows along the first direction DR1 which is the horizontal (or row) direction. The first and second emission areas EA1 and EA2 may be alternately arranged in the order of the first and second emission areas EA1 and EA2 according to the position or order of the rows in which they are arranged. Alternatively, the second and first emission areas EA2 and EA1 may be alternately arranged in that order.

On the other hand, the third emission areas EA3 and the fourth emission areas EA4 may be alternately arranged in even-numbered rows along the first direction DR1 which is the horizontal (or row) direction. The third and fourth emission areas EA3 and EA4 may be alternately arranged in the order of the third and fourth emission areas EA3 and EA4 according to the position or order of the rows in which they are arranged. Alternatively, the fourth and third emission areas EA4 and EA3 may be alternately arranged in that order. Accordingly, the first and second emission areas EA1 and EA2 may be alternately arranged in odd-numbered rows along the first direction DR1, and third and fourth light-emitting regions EA3 and EA4 may be alternately arranged in even-numbered rows along the first direction DR1.

The first and second emission areas EA1 and EA2 and the third and fourth emission areas EA3 and EA4 may be arranged in a zigzag form along the second direction DR2 that is the vertical direction (i.e., a column direction). Specifically, the first emission areas EA1 and the third emission areas EA3 may be alternately arranged along the fourth direction DR4 that is a first diagonal direction, and the second emission areas EA2 and the fourth emission areas EA4 may also be alternately arranged along the fourth direction DR4 that is the first diagonal direction. In addition, the second emission areas EA2 and the third emission areas EA3 may be alternately arranged along the fifth direction DR5 that is a second diagonal direction intersecting the first diagonal direction, and the fourth emission areas EA4 and the first emission areas EA1 of other adjacent pixels PX may be alternately arranged along the fifth direction DR5.

The sizes or planar areas of the first to fourth emission areas EA1 to EA4 of each pixel PX may be the same as or different from each other. Likewise, the sizes or planar areas of the first to fourth light emitting elements LE1 to LE4 respectively formed in the first to fourth emission areas EA1 to EA4 may be the same as or different from each other.

The area of the first emission area EA1, the area of the second emission area EA2, the area of the third emission area EA3, and the area of the fourth emission area EA4 may be substantially the same, but embodiments of the present disclosure are not limited thereto. For example, the area of the first emission area EA1 and the area of the second emission area EA2 may be different from each other, the area of the second emission area EA2 and the area of the third emission area EA3 may also be different from each other, and the area of the third emission area EA3 and the area of the fourth emission area EA4 may be the same as each other.

Also, the distance between the first emission area EA1 and the second emission area EA2 adjacent to each other in the horizontal or diagonal direction, the distance between the second emission area EA2 and the third emission area EA3, the distance between the first emission area EA1 and the third emission area EA3, and the distance between the third emission area EA3 and the fourth emission area EA4 may be substantially the same, but are different from one another. Embodiments of the present disclosure are not limited thereto.

In addition, the first emission area EA1 may emit the first light, the second emission area EA2 may emit the second light, the third emission area EA3 may emit the third light, and the fourth emission area EA4 may emit the same light as one of the first to third lights, but the present disclosure is not limited thereto. For example, the first emission area EA1 may emit the second light, the second emission area EA2 may emit the first light, and the third and fourth emission areas EA3 and EA4 may emit the third light. Alternatively, the first emission area EA1 may emit the third light, the second emission area EA2 may emit the third light, and the third and fourth emission areas EA3 and EA4 may emit the first light. Alternatively, at least one of the first to fourth emission areas EA1 to EA4 may emit fifth light. Here, the fifth light may be light in the yellow wavelength range. That is, a main peak wavelength of the fifth light may be in a range of approximately 550 nm to 600 nm, but embodiments of the present disclosure are not limited thereto.

Hereinafter, detailed structures and features, such as the size, planar area, and the like, of each of the first to fourth emission areas EA1 to EA4 and the first to fourth light emitting elements LE1 to LE4 will be described in greater detail with reference to the accompanying drawings. Features in which emission wavelength ranges of the first to fourth light emitting elements LE1 to LE4 are formed to be different will also be described in more detail with reference to the accompanying drawings.

The plurality of emission areas EA1, EA2, EA3, and EA4 of each pixel area PX_d may be defined by a partition wall PW. The partition wall PW may be disposed in such a manner so as to enclose (e.g., surround) each of the first to fourth light emitting elements LE1 to LE4 disposed in the light emission areas EA1, EA2, EA3, and EA4, respectively. The partition wall PW may be spaced from each of the first to fourth light emitting elements LE1 to LE4. The partition wall PW may have a mesh shape or a grid shape in a plan view.

In FIGS. 2 and 3, each of the plurality of emission areas EA1, EA2, EA3, and EA4 defined by the partition wall PW has a planar shape of a rhombus shape forming a Pentile® (e.g., RGBG) matrix form, but embodiments of the present disclosure are not limited thereto. For example, each of the plurality of emission areas EA1, EA2, EA3, and EA4 defined by the partition wall PW may have a polygonal shape, such as a rectangular shape or a triangular shape, other than a rhombic shape, a circular shape, an elliptical shape, or an irregular shape.

A first pad part PDA1 may be disposed in the non-display area NDA. The first pad part PDA1 may be disposed on the upper side (in the second direction DR2) of the display panel 100. The first pad part PDA1 may include first pads PD1 connected to an external circuit board. In one or more embodiments, second pad unit PDA2 may be disposed in the non-display area NDA. The second pad part PDA2 may be disposed on the lower side (in the second direction DR2) of the semiconductor circuit board 110. The second pad unit PDA2 may include second pads to be connected to an external circuit board. In one or more embodiments, the second pad part PDA2 may be omitted.

Figure 4:
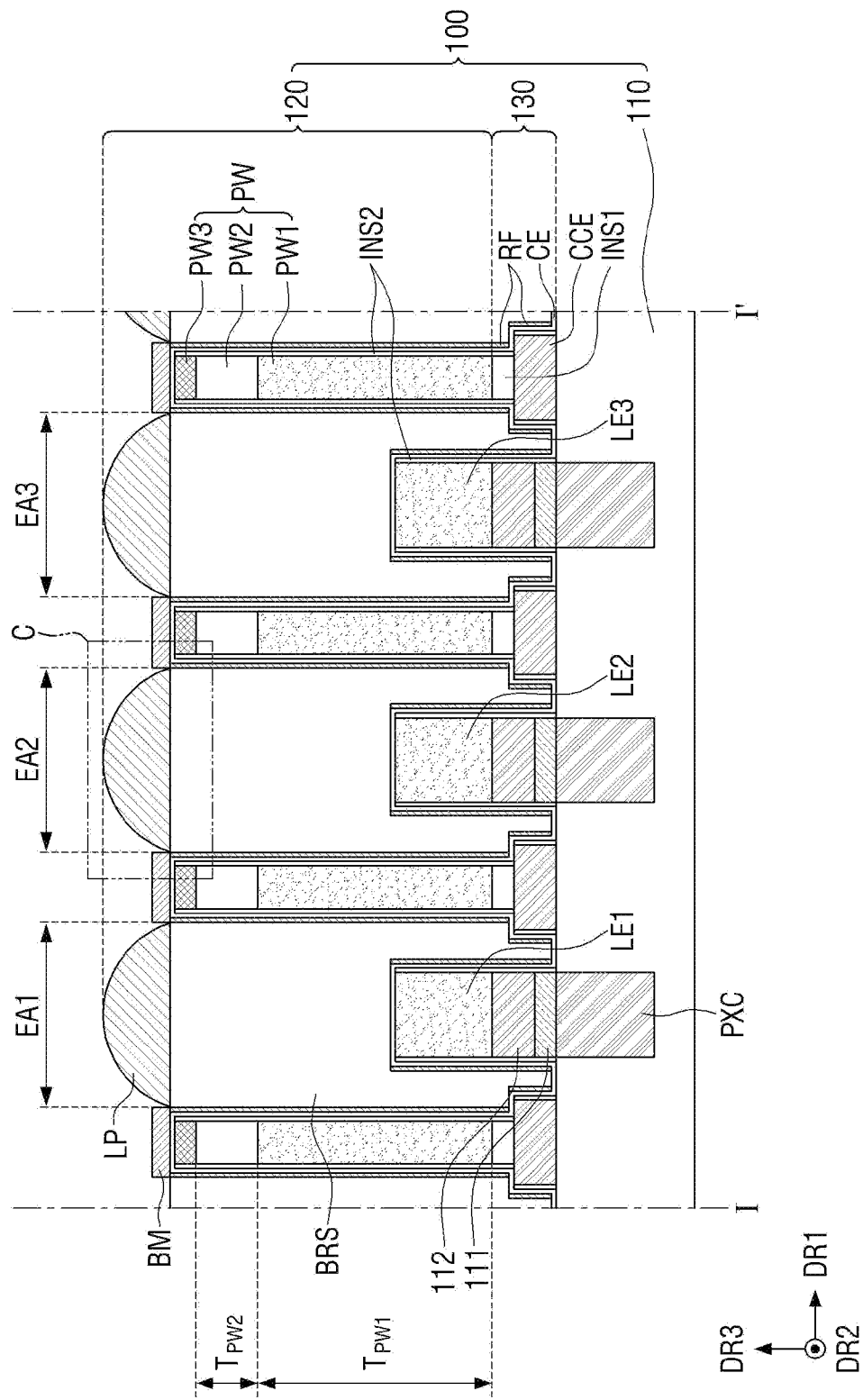
FIG. 4 is a cross-sectional view illustrating an example of a display panel taken along the line I-I' of FIG. 3.

FIG. 4 is a cross-sectional view illustrating an example of a display panel taken along the line I-I' of FIG. 3.

Referring to FIG. 4 first, the display panel 100 may include the semiconductor circuit board 110, a conductive connection layer 130, and a light emitting element layer 120.

The semiconductor circuit board 110 may include a plurality of pixel circuit units PXC and pixel electrodes 111. The conductive connection layer 130 may include connection electrodes 112, first pads PD1, a common connection electrode CCE, and a first insulating layer INS1. In some embodiments, the pixel electrode 111 may be part of the conductive connection layer 130.

The semiconductor circuit board 110 may be a silicon wafer substrate formed using a semiconductor process. The plurality of pixel circuit units PXC of the semiconductor circuit board 110 may be formed using a semiconductor process.

The plurality of pixel circuit units PXC may be disposed in the display area (DA of FIG. 2). Each of the plurality of pixel circuit units PXC may be connected to a corresponding pixel electrode 111. That is, the plurality of pixel circuit units PXC and the plurality of pixel electrodes 111 may be connected to each other in one-to-one correspondence. Each of the plurality of pixel circuit units PXC may overlap a corresponding one of the light emitting elements LE1 to LE4 in the third direction DR3. Various other modified circuit structures, such as a 3T1C structure, a 2T1C structure, a 7T1C structure, a 6T1C structure, and the like, may be applied to each of the pixel circuit units PXC.

Figure 5:
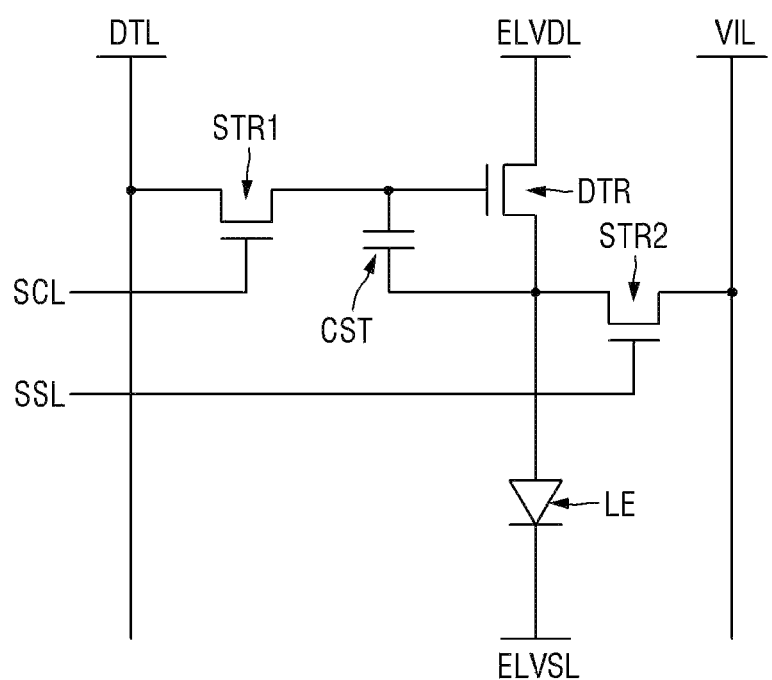
FIG. 5 is an equivalent circuit diagram of one pixel of the display device shown in FIG. 2.

FIG. 5 is an equivalent circuit diagram of one pixel of the display device shown in FIG. 2.

Referring to FIG. 5, each pixel circuit unit PXC of a pixel according to one or more embodiments may include three transistors DTR, STR1, and STR2 and one storage capacitor CST.

The driving transistor DTR adjusts the current flowing to any one of the light emitting elements LE from a first power line ELVDL which is supplied with a first power supply voltage according to a voltage difference between a gate electrode and a source electrode. The gate electrode of the driving transistor DTR may be connected to a first electrode of the first transistor STR1, the source electrode thereof may be connected to a first electrode of any one light emitting element LE, and a drain electrode thereof may be connected to the first power line ELVDL to which the first power supply voltage is applied.

The first transistor STR1 is turned on by a scan signal of a scan line SCL to connect a data line DTL to the gate electrode of the driving transistor DTR. The gate electrode of the first transistor STR1 may be connected to the scan line SCL, a first electrode thereof may be connected to the gate electrode of the driving transistor DTR, and a second electrode thereof may be connected to the data line DTL.

The second transistor STR2 is turned on by a sensing signal of the sensing signal line SSL to connect an initialization voltage line VIL to the source electrode of the driving transistor DTR. The gate electrode of the second transistor STR2 may be connected to the sensing signal line SSL, the first electrode thereof may be connected to the initialization voltage line VIL, and the second electrode thereof may be connected to the source electrode of the driving transistor DTR.

In one or more embodiments, the first electrode of each of the first and second transistors STR1 and STR2 may be a source electrode, and the second electrode may be a drain electrode. However, the opposite case may also be true.

The storage capacitor CST is formed between the gate electrode and the source electrode of the driving transistor DTR. The storage capacitor CST stores a difference voltage between a gate voltage and a source voltage of the driving transistor DTR.

Each of the driving transistor DTR and the first and second transistors STR1 and STR2 may be formed as a thin-film transistor (TFT). In one or more embodiments, although each of the driving transistor DTR and the first and second transistors STR1 and STR2 is described as an N-type metal oxide semiconductor field effect transistor (MOSFET) in FIG. 5, embodiments are not limited thereto. For example, each of the driving transistor DTR and the first and second transistors STR1 and STR2 may also be formed as a P-type MOSFET. In one or more embodiments, some of the transistors DTR, STR1, and STR2 may be formed as N-type MOSFETs, and the others may be formed as P-type MOSFETs.

Figure 6:
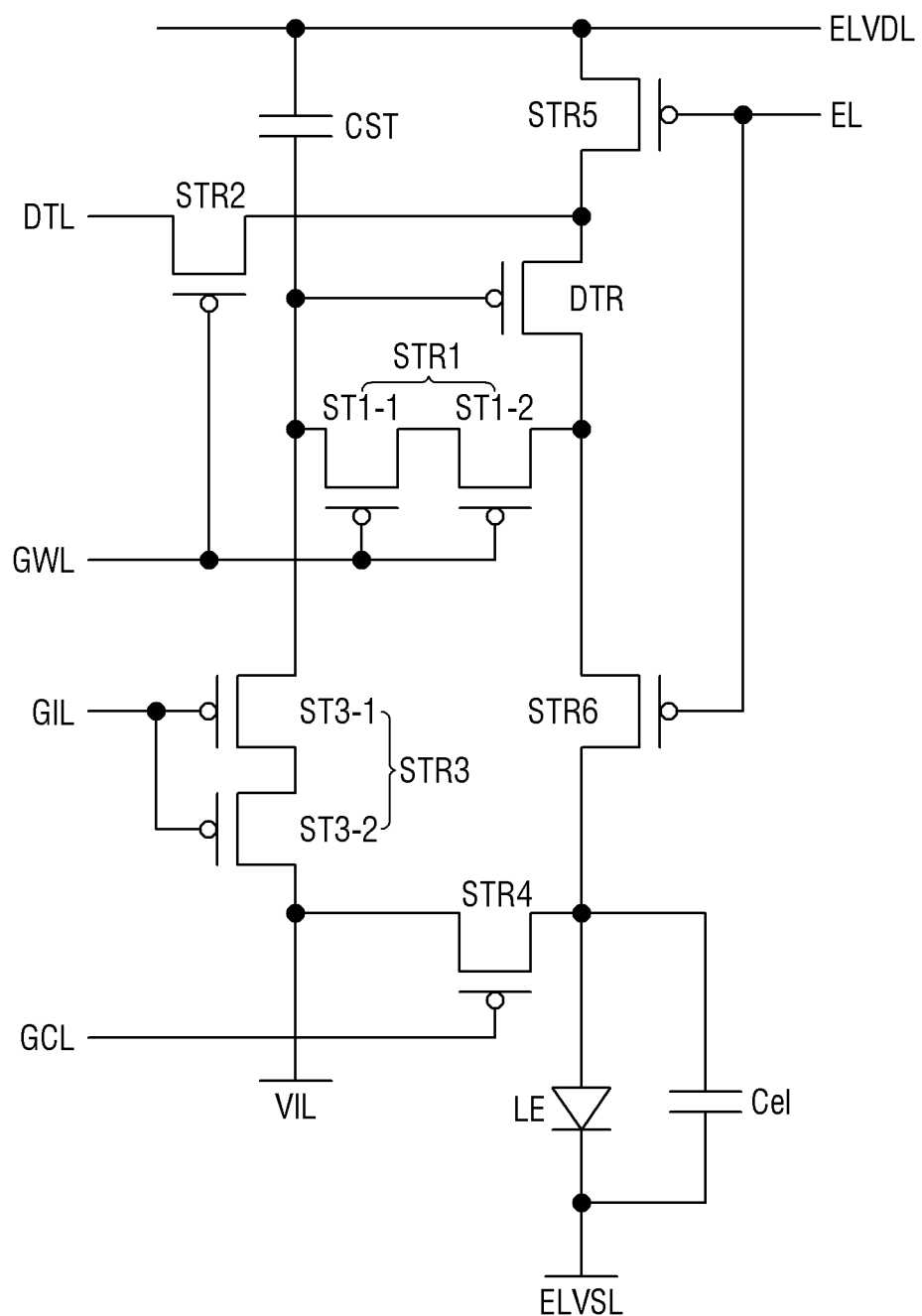
FIG. 6 is an equivalent circuit diagram of one pixel of a display device according to one or more embodiments.

FIG. 6 is an equivalent circuit diagram of one pixel of a display device according to another embodiment.

Referring to FIG. 6, the pixel circuit unit PXC of each pixel includes a driving transistor DTR, switch elements, and a capacitor CST. The switch elements may include first to sixth transistors STR1, STR2, STR3, STR4, STR5, and STR6.

The driving transistor DTR includes a gate electrode, a first electrode, and a second electrode. The driving transistor DTR controls a drain-source current Ids (hereinafter referred to as a "driving current") flowing between the first electrode and the second electrode according to a data voltage applied to the gate electrode.

The capacitor CST is formed between the gate electrode of the driving transistor DTR and a first power line ELVDL. One electrode of the capacitor CST may be connected to the gate electrode of the driving transistor DTR, and the other electrode may be connected to the first power line ELVDL.

When a first electrode of each of the first to sixth transistors STR1, STR2, STR3, STR4, STR5, STR6 and the driving transistor DTR is a source electrode, a second electrode may be a drain electrode. Alternatively, when the first electrode of each of the first to sixth transistors STR1 (e.g., ST1-1, ST1-2), STR2, STR3 (ST3-1, ST3-2), STR4, STR5, STR6 and the driving transistor DTR is a drain electrode, the second electrode may be a source electrode.

An active layer of each of the first to sixth transistors STR1, STR2, STR3, STR4, STR5, STR6 and the driving transistor DTR may be formed of any one of polysilicon, amorphous silicon, and an oxide semiconductor. When a semiconductor layer of each of the first to sixth transistors STR1, STR2, STR3, STR4, STR5, STR6 and the driving transistor DTR is formed of polysilicon, a process for forming the semiconductor layer may be a low-temperature polysilicon (LTPS) process.

Although in FIG. 6, the first to sixth transistors STR1, STR2, STR3, STR4, STR5, STR6 and the driving transistor DTR are each formed as a P-type MOSFET, but embodiments are not limited thereto, and they may be formed as an N-type MOSFET.

Further, a first power supply voltage of a first power line ELVDL, a second power supply voltage of a second power line ELVSL, and a third power supply voltage of a third lower line VIL may be set by taking into consideration the characteristics of the driving transistor DTR, the characteristics of light emitting elements LE, and the like.

Figure 7:
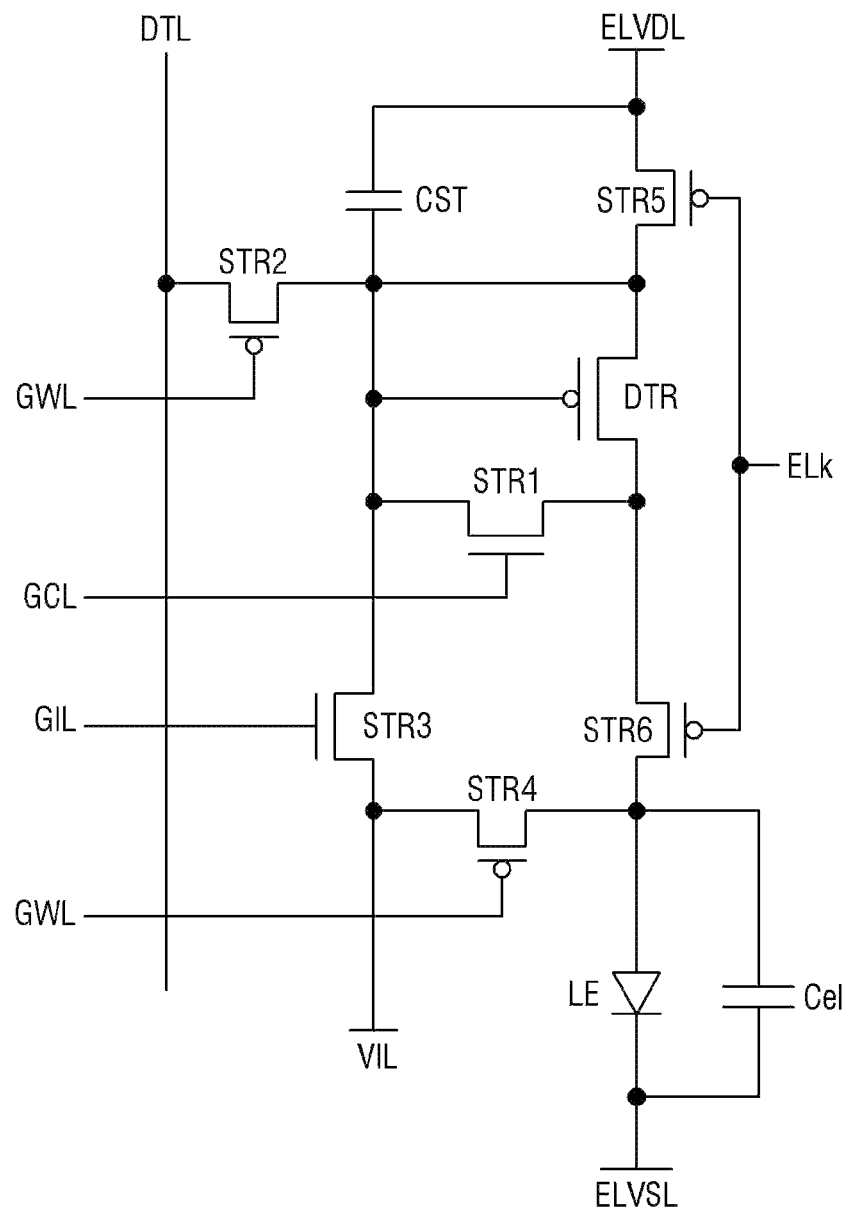
FIG. 7 is an equivalent circuit diagram of one pixel of a display device according to one or more embodiments.

FIG. 7 is an equivalent circuit diagram of one pixel of a display device according to one or more embodiments.

A pixel circuit unit PXC according to the embodiment of FIG. 7 is different of the embodiment of FIG. 6 in that a driving transistor DTR, a second transistor STR2, a fourth transistor STR4, a fifth transistor STR5, and a sixth transistor STR6 are each formed as a P-type MOSFET and a first transistor STR1 and a third transistor STR3 are each formed as an N-type MOSFET.

Referring to FIG. 7, an active layer of each of the driving transistor DTR, the second transistor STR2, the fourth transistor STR4, the fifth transistor STR5, and the sixth transistor STR6, which are formed as a P-type MOSFET, may be formed of polysilicon, and an active layer of each of the first transistor STR1 and the third transistor STR3, which are formed of an N-type MOSFET, may be formed of an oxide semiconductor.

The embodiment of FIG. 7 is different from the embodiment of FIG. 6 in that a gate electrode of the second transistor STR2 and a gate electrode of the fourth transistor STR4 are connected to write scan lines GWL and a gate electrode of the first transistor STR1 is connected to a control scan line GCL. In addition, because the first transistor STR1 and the third transistor STR3 are each formed as an N-type MOSFET in FIG. 7, a scan signal of a gate high voltage may be applied to the control scan line GCL and an initialization scan line GIL. In comparison, because the second transistor STR2, the fourth transistor STR4, the fifth transistor STR5, and the sixth transistor STR6 are each formed as a P-type MOSFET, a scan signal of a gate low voltage may be applied to the write scan lines GWL and an emission line EL. In one or more embodiments, a capacitor Cel may be connected across the light emitting element LE.

It should be noted that the equivalent circuit diagrams of pixels according to embodiments of the present disclosure are not limited to those shown in FIGS. 5 to 7. The equivalent circuit diagram of the pixel according to embodiments of the present disclosure may be formed in other known circuit structures that those skilled in the art may employ in addition to the embodiments shown in FIGS. 5 to 7.

Figure 8:
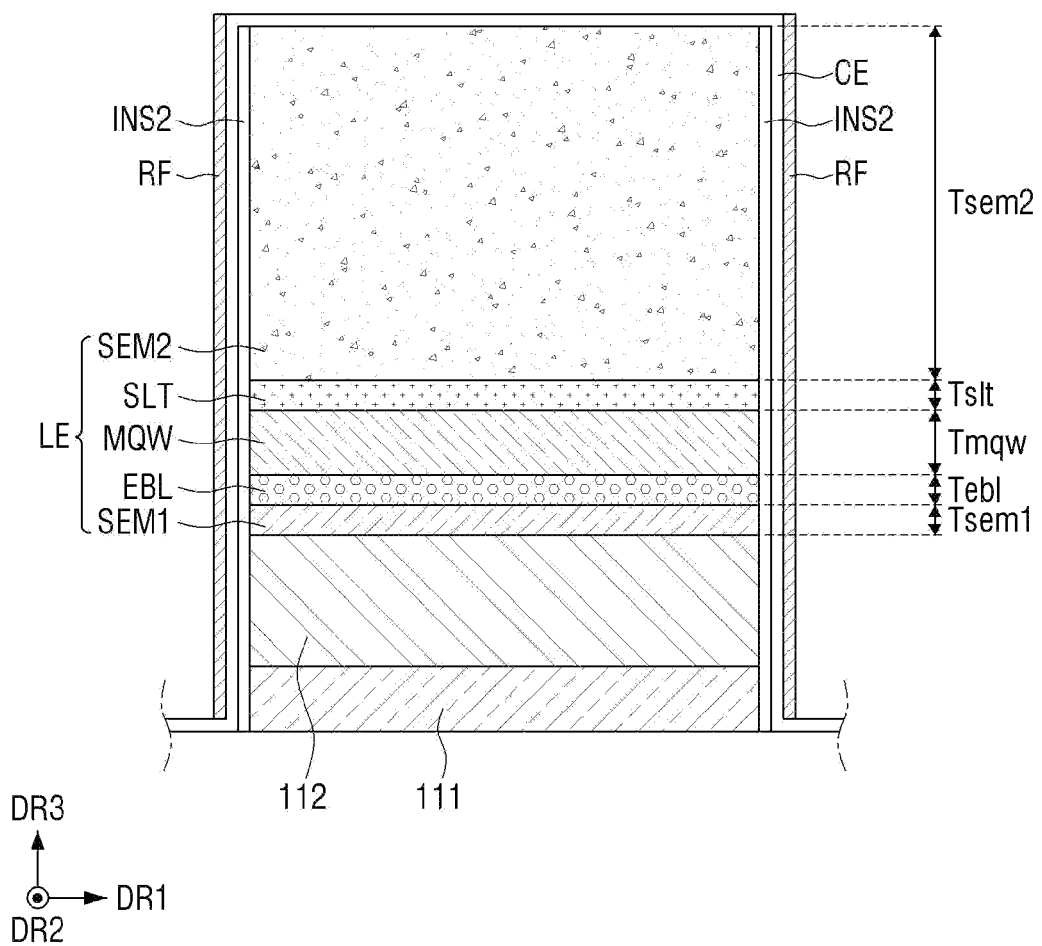
FIG. 8 is an enlarged cross-sectional view illustrating in detail an example of a light emitting element of FIG. 4.
Figure 9:
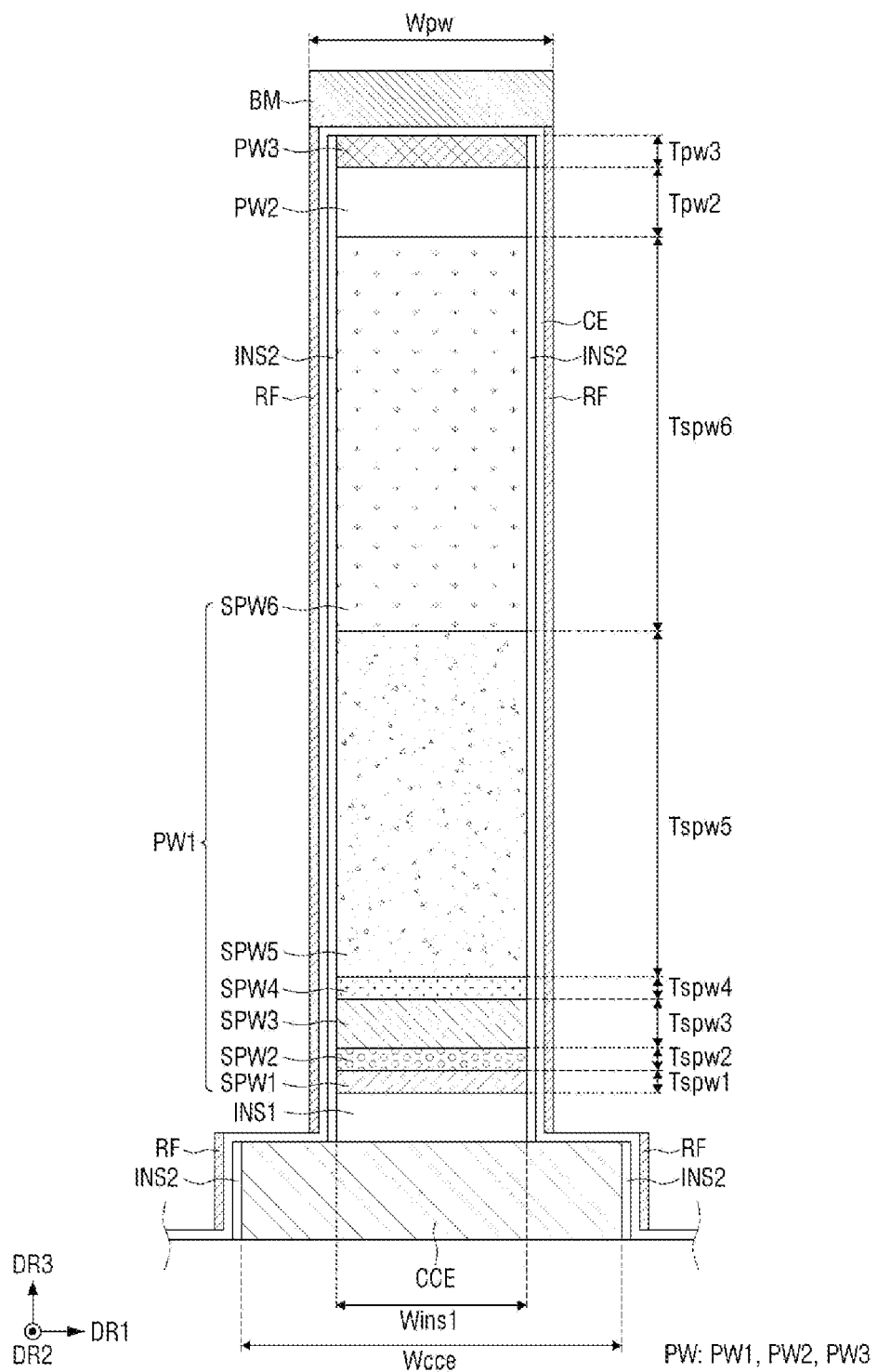
FIG. 9 is an enlarged cross-sectional view illustrating in detail an example of a partition wall of FIG. 4.

FIG. 8 is an enlarged cross-sectional view illustrating in detail an example of a light emitting element of FIG. 4. FIG. 9 is an enlarged cross-sectional view illustrating in detail an example of the partition wall of FIG. 4, and FIG. 10 is a cross-sectional view of an area C which is a lens formation area of FIG. 4.

Figure 10:
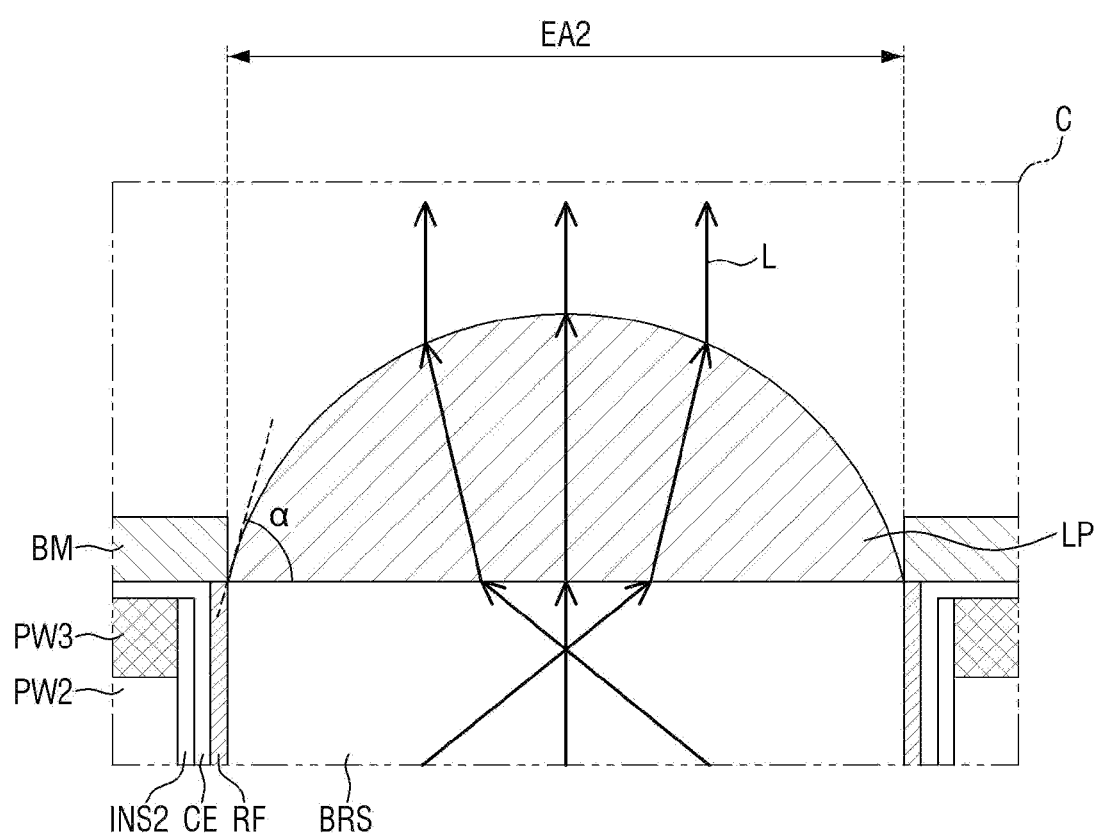
FIG. 10 is an enlarged cross-sectional view of an area C, which is a lens formation area of FIG. 4.

Referring to FIGS. 8 to 10 in conjunction with FIG. 4, each of pixel electrodes 111 may be disposed on a corresponding pixel circuit unit PXC. Each of the pixel electrodes 111 may be an exposed electrode exposed from the pixel circuit unit PXC. For example, each of the pixel electrodes 111 may be exposed from an upper surface of the pixel circuit unit PXC. Each of the pixel electrodes 111 may be integrally formed with the pixel circuit unit PXC. Each of the pixel electrodes 111 may be supplied with a pixel voltage or an anode voltage from the pixel circuit unit PXC. The pixel electrodes 111 may be formed of aluminum (Al).

Each of the connection electrodes 112 may be disposed on a corresponding pixel electrode 111. Each of the connection electrodes 112 may be disposed on the pixel electrode 111. The connection electrodes 112 may include a metal material to bond the pixel electrodes 111 to each of the light emitting elements LE1 to LE4. For example, the connection electrodes 112 may include at least one of gold (Au), copper (Cu), aluminum (Al), titanium (Ti), and tin (Sn), or may be formed of an alloy. Alternatively, the connection electrodes 112 may include a first layer including any one of gold (Au), copper (Cu), aluminum (Al), titanium (Ti), and tin (Sn) and a second layer including another one of gold (Au), copper (Cu), aluminum (Al), titanium (Ti), and tin (Sn). In this case, the second layer may be disposed on the first layer.

The common connection electrode CCE may be spaced from the pixel electrode 111 and the connection electrode 112. The common connection electrode CCE may be disposed in such a way so as to enclose the pixel electrode 111 and the connection electrode 112.

The common connection electrode CCE may be connected to any one of the first pads PD1 of the first pad part PDA1 in the non-display area NDA to receive a common voltage. The common connection electrode CCE may include the same material as the connection electrodes 112. For example, the common connection electrode CCE may include at least one of gold (Au), copper (Cu), aluminum (Al), titanium (Ti), and tin (Sn). When each of the connection electrodes 112 includes a first layer and a second layer, the common connection electrode CCE may include the same material as the first layer of each of the connection electrodes 112.

A first insulating layer INS1 may be disposed on the common connection electrode CCE. The first insulating layer INS1 may be formed as an inorganic layer, such as a silicon oxide ($SiO_2$) layer, an aluminum oxide ($Al_2O_3$) layer, or a hafnium oxide ($HfO_x$) layer. In the first direction DR1 or the second direction DR2, the width Wins1 of the first insulating layer INS1 may be smaller than the width Wcce of the common connection electrode CCE. Accordingly, a portion of an upper surface of the common connection electrode CCE may be exposed without being covered by the first insulating layer INS1. The exposed portion of the upper surface of the common connection electrode CCE that is not covered by the first insulating layer INS1 may be in contact with the common electrode CE. In this way, the common electrode CE may be connected to the common connection electrode CCE.

The partition wall PW is formed on the first insulating layer INS1, and the width Wpw of the partition wall PW may be substantially the same as the width Wins1 of the first insulating layer INS1.

The light emitting element layer 120 may include the light emitting elements LE1, LE2, and LE3, the partition wall PW, a second insulating layer INS2, the common electrode CE, a reflective layer RF, a light blocking member BM, and optical patterns LP. In one or more embodiments, the light emitting element layer 120 may also include a reflective member.

The light emitting element layer 120 may include first to fourth emission areas EA1 to EA4 defined by the partition wall PW. At least one of the light emitting element LE or the optical pattern LP may be disposed in each of the first to fourth emission areas EA1 to EA4.

Each of the light emitting elements LE1, LE2, and LE3 may be disposed on the connection electrode 112 in each of the emission areas EA1 to EA4. The length (or height) of each of the light emitting elements LE1, LE2, and LE3 in the third direction DR3 may be longer than the length in the horizontal direction. The length in the horizontal direction indicates a length in the first direction DR1 or a length in the second direction DR2. For example, the length of the first light emitting element LE1 in the third direction DR3 may be approximately 1 μm to 5 μm.

Each of the light emitting elements LE1, LE2, and LE3 includes a first semiconductor layer SEM1, an electron blocking layer EBL, an active layer MQW, a superlattice layer SLT, and a second semiconductor layer SEM2 in the third direction DR3. The first semiconductor layer SEM1, the electron blocking layer EBL, the active layer MQW, the superlattice layer SLT, and the second semiconductor layer SEM2 may be sequentially stacked along the third direction DR3.

The first semiconductor layer SEM1 may be disposed on the connection electrode 112. The first semiconductor layer SEM1 may be a semiconductor layer doped with a first conductivity type dopant, such as Mg, Zn, Ca, Se, Ba, or the like. For example, the first semiconductor layer SEM1 may be p-GaN doped with p-type Mg. The thickness of the first semiconductor layer SEM1 may be approximately 30 to 200 nm.

The electron blocking layer EBL may be disposed on the first semiconductor layer SEM1. The electron blocking layer EBL may be a layer for suppressing or preventing too many electrons from flowing into the active layer MQW. For example, the electron blocking layer EBL may be p-AlGaN doped with p-type Mg. The thickness of the electron blocking layer EBL may be approximately 10 to 50 nm. The electron blocking layer EBL may be omitted.

The active layer MQW may be divided into first to third active layers. Each of the first to third active layers may include a material having a single or multiple quantum well structure. When each of the first to third active layers includes a material having a multiple quantum well structure, the active layers may have a structure in which a plurality of well layers and barrier layers are alternately stacked. In this case, the first active layer may include InGaN or GaAs, and the second active layer and the third active layer may include InGaN, but embodiments are not limited thereto. Here, the first active layer may emit light by coupling of electron-hole pairs according to an electric signal. The first active layer may emit the first light having a main peak wavelength in a range of approximately 600 nm to 750 nm, that is, light in the red wavelength range. The second active layer may emit light by coupling of electron-hole pairs according to an electrical signal. The second active layer may emit the third light having a main peak wavelength in a range of approximately 480 nm to 560 nm, that is, light in the green wavelength range. The third active layer may emit light by coupling of electron-hole pairs according to an electrical signal. The third active layer may emit the second light having a main peak wavelength in a range of approximately 370 nm to 460 nm, that is, light in the blue wavelength range. As such, each of the first to third active layers may emit a different color of light according to the content of indium. For example, as the content of indium decreases, the wavelength range of the light emitted by each of the first to third active layers may shift to the red wavelength range, and as the content of indium increases, the wavelength range of the light emitted by each of the first to third active layers may shift to the blue wavelength range. The content of indium (In) in the first active layer may be higher than the content of indium (In) in the second active layer, and the content of indium (In) in the second active layer may be higher than the content of indium (In) in the third active layer. For example, the content of indium (In) in the third active layer may be 15%, the content of indium (In) in the second active layer may be 25%, and the content of indium (In) in the first active layer may be 35% or more. As such, because the color of emitted light may vary according to the content of indium in each of the first to third active layers, the light emitting element layer 120 of each of the light emitting elements LE1, LE2, and LE3 may emit the same or different light, such as the first light, the second light, and the third light, according to the indium content.

The superlattice layer SLT may be disposed on the active layer MQW. The superlattice layer SLT may be a layer to alleviate stress between the second semiconductor layer SEM2 and the active layer MQW. For example, the superlattice layer SLT may be formed of InGaN or GaN. The thickness of the superlattice layer SLT may be approximately 50 to 200 nm. The superlattice layer SLT may be omitted.

The second semiconductor layer SEM2 may be disposed on the superlattice layer SLT. The second semiconductor layer SEM2 may be doped with a second conductivity type dopant such as Si, Ge, or Sn. For example, the second semiconductor layer SEM2 may be n-GaN doped with n-type Si. The thickness of the second semiconductor layer SEM2 may be approximately 2 to 4 μm.

The partition wall PW may be spaced from each of the light emitting elements LE1 to LE4 disposed in each of the first to fourth emission areas EA1 to EA4. The partition wall PW may be disposed in such a way so as to enclose the light emitting elements LE1 to LE4 disposed in each of the first to fourth emission areas EA1 to EA4.

The partition wall PW may be disposed on the first insulating layer INS1. In the first and second directions DR1 and DR2, the width Wpw of the partition wall PW may be the same as the width Wins1 of the first insulating layer INS1 and may be smaller than the width Wcce of the common connection electrode CCE. The partition wall PW may be spaced from the light emitting elements LE.

The partition wall PW may include a first partition wall PW1, a second partition wall PW2, and a third partition wall PW3.

The first partition wall PW1 may be disposed on the first insulating layer INS1. The first partition wall PW1 is formed in the same process as forming the light emitting element LE, and thus at least a portion of the first partition wall PW1 may include the same material as the light emitting element LE.

The first partition wall PW1 may include a plurality of sub partition walls SPW1 to SPW6 that are sequentially stacked along the third direction DR3. For example, the first partition wall PW1 may include a first sub partition wall SPW1, a second sub partition wall SPW2, a third sub partition wall SPW3, a fourth sub partition wall SPW4, a fifth sub partition wall SPW5, and a sixth sub partition wall SPW6.

The first sub partition wall SPW1 may be formed of the same material as the first semiconductor layer SEM1 of the light emitting element LE. The first sub partition wall SPW1 may be formed by the same process as forming the first semiconductor layer SEM1 of the light emitting element LE. The thickness Tspw1 of the first sub partition wall SPW1 may be substantially the same as the thickness Tsem1 of the first semiconductor layer SEM1 of the light emitting element LE.

The second sub partition wall SPW2 may be formed of the same material as the electron blocking layer EBL of the light emitting elements LE1 to LE4. The second sub partition wall SPW2 may be formed in the same process as forming the electron blocking layer EBL of the light emitting elements LE1 to LE4. The thickness Tspw2 of the second sub partition wall SPW2 may be substantially the same as the thickness Tebl of the electron blocking layer EBL of the light emitting elements LE1 to LE4. When the electron blocking layer EBL is omitted, the second sub partition wall SPW2 may also be omitted.

The third sub partition wall SPW3 may be formed of the same material as the active layer MQW of the light emitting elements LE1 to LE4. The third sub partition wall SPW3 may be formed in the same process as forming the active layer MQW of the light emitting elements LE1 to LE4. The thickness Tspw3 of the third sub partition wall SPW3 may be substantially the same as the thickness Tmqw of the active layer MQW of the light emitting element LE.

The fourth sub partition wall SPW4 may be formed of the same material as the superlattice layers SLT of the light emitting elements LE1 to LE4. The fourth sub partition wall SPW4 may be formed in the same process as forming the superlattice layer SLT of the light emitting elements LE1 to LE4. The thickness Tspw4 of the fourth sub partition wall SPW4 may be substantially the same as the thickness Tslt of the superlattice layer SLT of the light emitting element LE.

The fifth sub partition wall SPW5 may be formed of the same material as the second semiconductor layer SEM2 of the light emitting elements LE1 to LE4. The fifth sub partition wall SPW5 may be formed by the same process as that of the second semiconductor layer SEM2 of the light emitting elements LE1 to LE4. In the manufacturing process of the display panel 100, the fifth sub partition wall SPW5 is not removed, but a part of the second semiconductor layer SEM2 of the light emitting element LE is removed, so that the thickness Tspw5 of the fifth sub partition wall SPW5 may be greater than the thickness Tsem2 of the second semiconductor layer SEM2 of each of the light emitting elements LE1 to LE4.

The sixth sub partition wall SPW6 may be formed as a semiconductor layer which is not doped with a dopant, that is, an undoped semiconductor layer. For example, the sixth sub partition wall SPW6 may be undoped GaN. The thickness Tspw6 of the sixth sub partition wall SPW6 may be greater than the thickness Tsem2 of the second semiconductor layer SEM2 of the light emitting element LE. The thickness Tspw6 of the sixth sub partition wall SPW6 may be approximately 2 to 3 µm.

The second partition wall PW2 and the third partition wall PW3 serve as a mask to prevent the first partition wall PW1 from being etched in the manufacturing process for forming the light emitting element LE and the partition wall PW.

The second partition wall PW2 may be disposed on the first partition wall PW1. The second partition wall PW2 may be formed as an inorganic layer such as a silicon oxide ($SiO_2$) layer, an aluminum oxide ($Al_2O_3$) layer, or a hafnium oxide ($HfO_x$) layer. The thickness Tpw2 of the second partition wall PW2 may be approximately 1 to 2 µm.

The third partition wall PW3 may be disposed on the second partition wall PW2. The third partition wall PW3 may include a conductive material such as nickel (Ni). The thickness Tpw3 of the third partition wall PW3 may be approximately 0.01 to 1 µm.

The second insulating layer INS2 may be disposed on side surfaces of the first insulating layer INS1, side surfaces of the common connection electrode CCE, side surfaces of the partition wall PW, side surfaces of each of the pixel electrodes 111, side surfaces of each of the connection electrodes 112, and side surfaces of each of the light emitting elements LE1 to LE4. The second insulating layer INS2 may be formed as an inorganic layer, such as a silicon oxide ($SiO_2$) layer, an aluminum oxide ($Al_2O_3$) layer, or a hafnium oxide ($HfO_x$) layer. The thickness of the second insulating layer INS2 may be approximately 0.1 µm.

The common electrode CE may be disposed on the upper surface and side surfaces of each of the light emitting elements LE1 to LE4 and the upper surface and side surfaces of the partition wall PW. That is, the common electrode CE may be disposed to cover the upper surface and side surfaces of each of the light emitting elements LE1 to LE4 and the upper surface and side surfaces of the partition wall PW.

The common electrode CE may be in contact with the second insulating layer INS2 which is disposed on the side surfaces of the first insulating layer INS1, side surfaces of the common connection electrode CCE, the side surfaces of the partition wall PW, the side surfaces of each of the pixel electrodes 111, side surfaces of each of the connection electrodes 112, and the side surfaces of each of the light emitting elements LE1 to LE4. Also, the common electrode CE may be in contact with the upper surface of the common connection electrode CCE, the upper surface of each of the light emitting elements LE, and the upper surface of the partition wall PW.

The common electrode CE may be in contact with an upper surface of the common connection electrode CCE exposed without being covered by the second insulating layer INS2 and the upper surface of each of the light emitting elements LE1 to LE4. Accordingly, the common voltage supplied to the common connection electrode CCE may be applied to the light emitting elements LE1 to LE4. That is, one end of the light emitting elements LE1 to LE4 may be supplied with the pixel voltage or the anode voltage of the pixel electrode 111 through the connection electrode 112, and the other end may be supplied with the common voltage through the common electrode CE. The light emitting element LE may emit light at a desired luminance (e.g., a set or predetermined luminance) according to a voltage difference between the pixel voltage and the common voltage.

The common electrode CE may include a transparent conductive material. The common electrode CE may be formed of a transparent conductive oxide (TCO), such as indium tin oxide (ITO) or indium zinc oxide (IZO). The thickness of the common electrode CE may be approximately 0.1 µm.

The reflective layer RF serves to reflect light traveling in the upper, lower, left, and right side directions, rather than in the upward direction, among the light emitted from the light emitting elements LE1 to LE4. The reflective layer RF may include a highly reflective metal material, such as aluminum (Al). The thickness of the reflective layer RF may be approximately 0.1 µm.

The reflective layer RF may be disposed on the side surfaces of the common connection electrode CCE, the side surfaces of the partition wall PW, the side surfaces of each of the pixel electrodes 111, the side surfaces of each of the connection electrodes 112, and the side surfaces of each of the light emitting elements LE1 to LE4. The reflective layer RF may be in contact with the common electrode CE which is disposed on the side surfaces of the common connection electrode CCE, the side surfaces of the partition wall PW, the side surfaces of each of the pixel electrodes 111, the side surfaces of each of the connection electrodes 112, and the side surfaces of each of the light emitting elements LE1 to LE4.

In one or more embodiments, a base resin BRS may be disposed on a protective film in each of the light emitting elements LE1 to LE4. The base resin BRS may include a light-transmitting organic material. For example, the base resin BRS may include an epoxy-based resin, an acrylic-based resin, a cardo-based resin, or an imide-based resin.

The base resin BRS may further include a scatterer for scattering the light of the light emitting elements LE1 to LE4 in a random direction. In this case, the scatterer may include metal oxide particles or organic particles. For example, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). In addition, the organic particles may include an acrylic-based resin or an urethane-based resin. The diameter of the scatterers may be several to several tens of nanometers.

The light blocking member BM may be disposed on the partition wall PW. The light blocking member BM may include a light blocking material. For example, the light blocking member BM may include an organic material or a metal material capable of blocking light, but is not limited thereto. The light blocking member BM may be disposed between the adjacent emission areas EA1, EA2, EA3 and EA4, and prevent color mixing between the light emitting elements LE1 to LE4 of each of the emission areas EA1, EA2, EA3 and EA4 which emit light in different wavelength ranges from each other. In addition, the light blocking member BM may absorb at least a portion of external light incident on the light emitting element layer 120 from the outside to reduce reflection of external light. The light blocking member BM is disposed on the partition wall PW, and may be further extended to each of the emission areas EA1, EA2, EA3, and EA4. That is, the width of the light blocking member BM may be greater than the width of the partition wall PW.

Each of the optical patterns LP may be selectively disposed on each of the emission areas EA1, EA2, EA3, and EA4. Each of the optical patterns LP may be disposed directly on the base resin BRS of each of the light emission areas EA1, EA2, EA3, and EA4. The optical pattern LP may have a shape that protrudes in an upper direction (e.g., a direction from the light emitting elements LE1 to LE4 toward each optical pattern LP). For example, the cross-sectional shape of each optical pattern LP may include an upwardly convex lens shape. Each optical pattern LP may be disposed on the base resin BRS on a lower portion thereof and the light blocking member BM. The width of each optical pattern LP may be equal to, greater than, or smaller than the width of each of the emission areas EA1, EA2, EA3, and EA4. Each of the optical patterns LP may condense the first to third lights transmitted through the base resin BRS in the respective emission areas EA1, EA2, EA3, and EA4. The arrangement of the respective optical patterns LP and the condensing of the first to third lights of each optical pattern LP will be described with reference to FIG. 10.

Referring to FIG. 10, each optical pattern LP may condense the first to third lights transmitted through the base resin BRS on each of the emission areas EA1, EA2, EA3, and EA4. Hereinafter, for convenience of description, the first to third lights will be collectively referred to as light L.

The light L provided from each of the light emitting elements LE1 to LE4 may pass through the base resin BRS intact, or may be reflected by scatterers in the base resin BRS and may be applied to each optical pattern LP.

The refractive index of each optical pattern LP is formed to be greater than the refractive index of the base resin BRS, so that the light L is refracted to such an extent that it passes through the boundary between the base resin BRS and each optical pattern LP and is condensed. In order to increase light concentration through each optical pattern LP, the light L obliquely traveling in the lateral direction having a suitable angle (e.g., a set or predetermined angle) with respect to the upper direction (the third direction DR3) due to the optical pattern LP must be propagated in the lateral direction in which the angle with respect to the upper direction DR3 is reduced by each optical pattern LP. In order to change the propagation direction of the obliquely traveling light L, a difference in refractive index between each optical pattern LP and an adjacent member and a shape of each optical pattern LP must be adjusted. Further, when the refractive index of the optical pattern LP is adjusted to be larger than that of the base resin BRS and the cross-sectional shape of the optical pattern LP is formed in the shape of a converging lens which is typically used for light concentration, more reliable concentration of light onto the central portion of the second emission area EA2 may be enabled. Therefore, in general, a converging lens refers to a case where an initial angle α is 30 degrees or more. In the present disclosure, the initial angle means an angle between a tangent line at the contact point where a lower surface of the optical pattern LP in contact with an upper surface of the base resin BRS meets and a convex surface of the optical pattern LP and the lower surface of the optical pattern LP in contact with the upper surface of the base resin BRS in FIG. 10.

Figure 11:
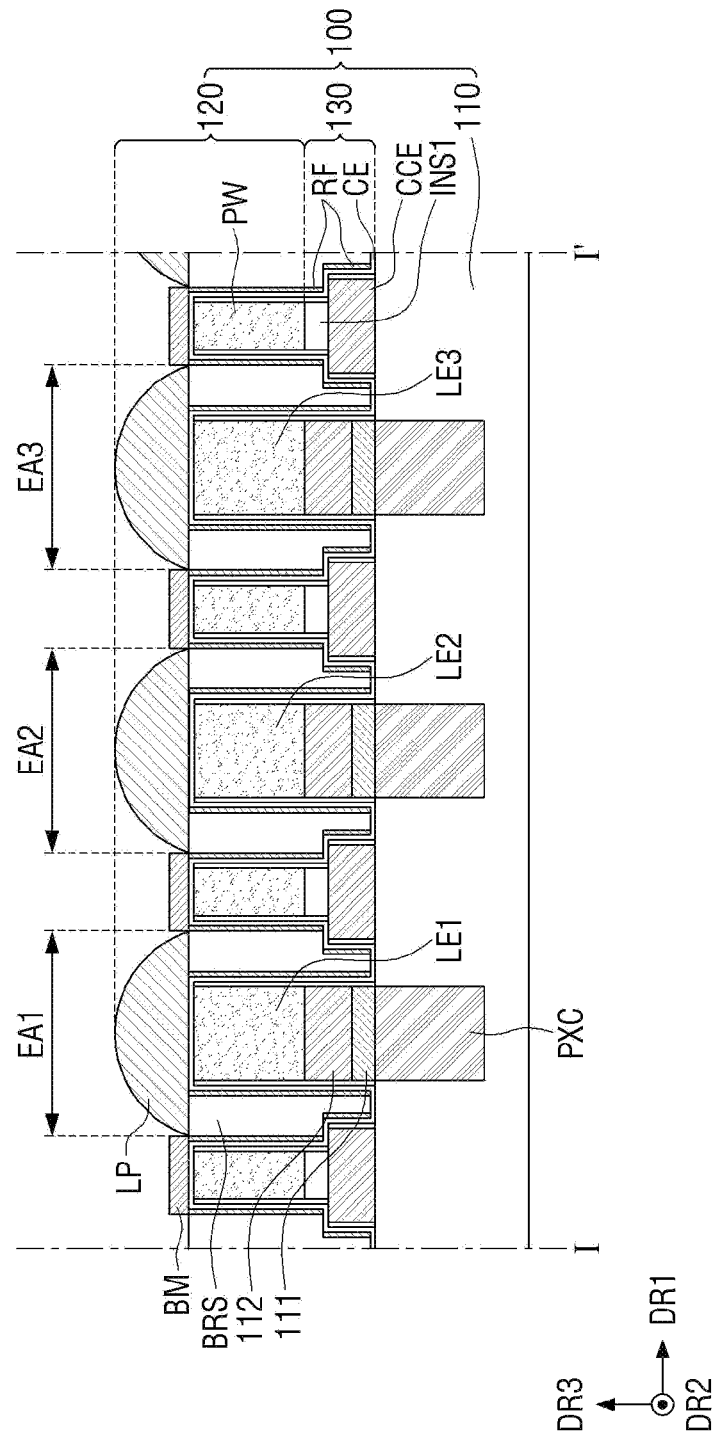
FIG. 11 is a cross-sectional view illustrating an example of the display panel taken along the line I-I' of FIG. 3.

FIG. 11 is a cross-sectional view illustrating an example of the display panel taken along the line I-I' of FIG. 3.

Referring to FIG. 11, the partition wall PW is formed in such a way so as to enclose (e.g., surround) each of the light emitting elements LE1 to LE4 disposed in the first to fourth emission areas EA1 to EA4, and the partition wall PW may be spaced from each of the light emitting elements LE1 to LE4 by a suitable distance (e.g., a set or predetermined distance).

The partition wall PW is formed in the same process as forming the light emitting element LE, and thus at least a portion of the partition wall PW may include the same material as each of the light emitting elements LE1, LE2, and LE3. Also, the partition wall PW is formed in the same process as forming each of the light emitting elements LE1, LE2, and LE3, and thus the partition wall PW may be formed at the same height as that of any one light emitting element LE1, LE2, LE3, or to have the same length as the length in the third direction DR3 of any one light emitting element LE1, LE2, LE3.

The partition wall PW may include a plurality of sub partition walls SPW1 to SPW6 sequentially stacked along the third direction DR3, for example, the first to sixth sub partition walls SPW1 to SPW6 described with reference to FIG. 9. Accordingly, the first sub partition wall SPW1 may be formed of the same material as that of the first semiconductor layer SEM1 of the light emitting elements LE1 to LE4 through the same process as that of the first semiconductor layer SEM1. The second sub partition wall SPW2 may be formed of the same material as that of the electron blocking layer EBL of the light emitting elements LE1 to LE4 through the same process as that of the electron blocking layer EBL. The third sub partition wall SPW3 may be formed of the same material as that of the active layer MQW of the light emitting elements LE1 to LE4 through the same process as that of the active layer MQW. The fourth sub partition wall SPW4 may be formed of the same material as that of the superlattice layer SLT of the light emitting elements LE1 to LE4 through the same process as that of the superlattice layer SLT. The fifth sub partition wall SPW5 may be formed of the same material as that of the second semiconductor layer SEM2 of the light emitting elements LE1 to LE4 through the same process as the second semiconductor layer SEM2. The sixth sub partition wall SPW6 may be formed as a semiconductor layer which is not doped with a dopant, that is, an undoped semiconductor layer. Accordingly, the partition wall PW consisting of the first to sixth sub partition walls SPW1 to SPW6 may be formed at the same height or to have the same length in the third direction DR3 as the light emitting element LE.

Each of the light emission areas EA1, EA2, EA3, and EA4 defined by the partition wall PW is filled with the base resin BRS including a light-transmitting organic material. The base resin BRS fills the entire space of each of the emission areas EA1, EA2, EA3, and EA4 with the protective film of each of the light emitting elements LE1 to LE4. The light blocking member BM is disposed on the partition wall PW, and each optical pattern LP is disposed on each of the emission areas EA1, EA2, EA3, and EA4 except for the light blocking member BM.

Figure 12:
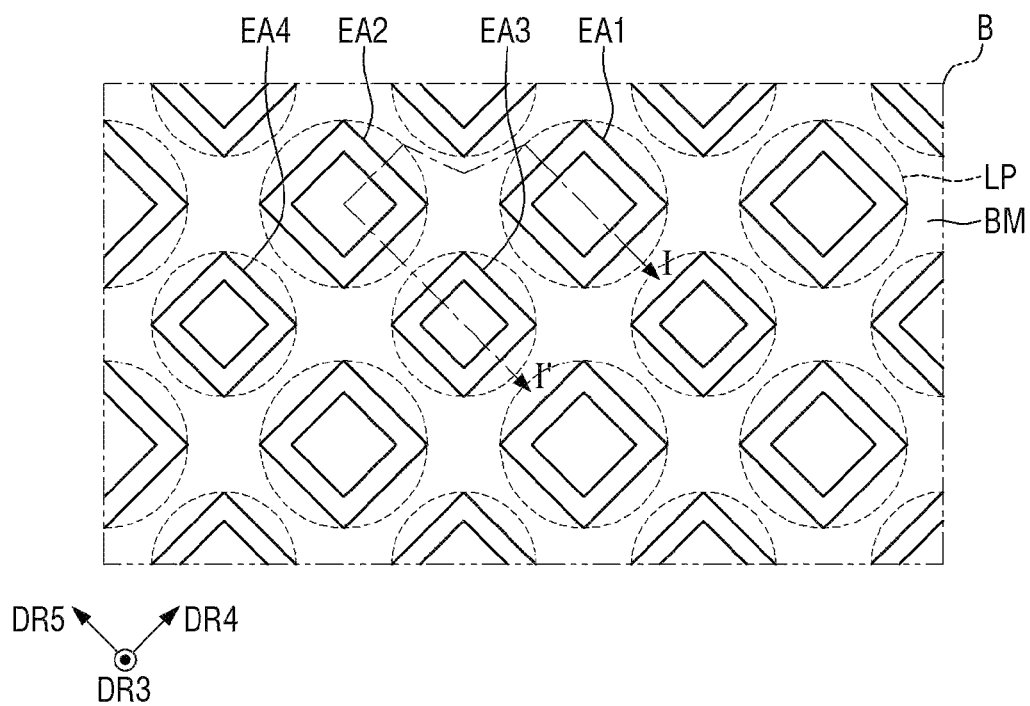
FIG. 12 is a layout view illustrating in detail the pixels shown in the area B of FIG. 2.
Figure 13:
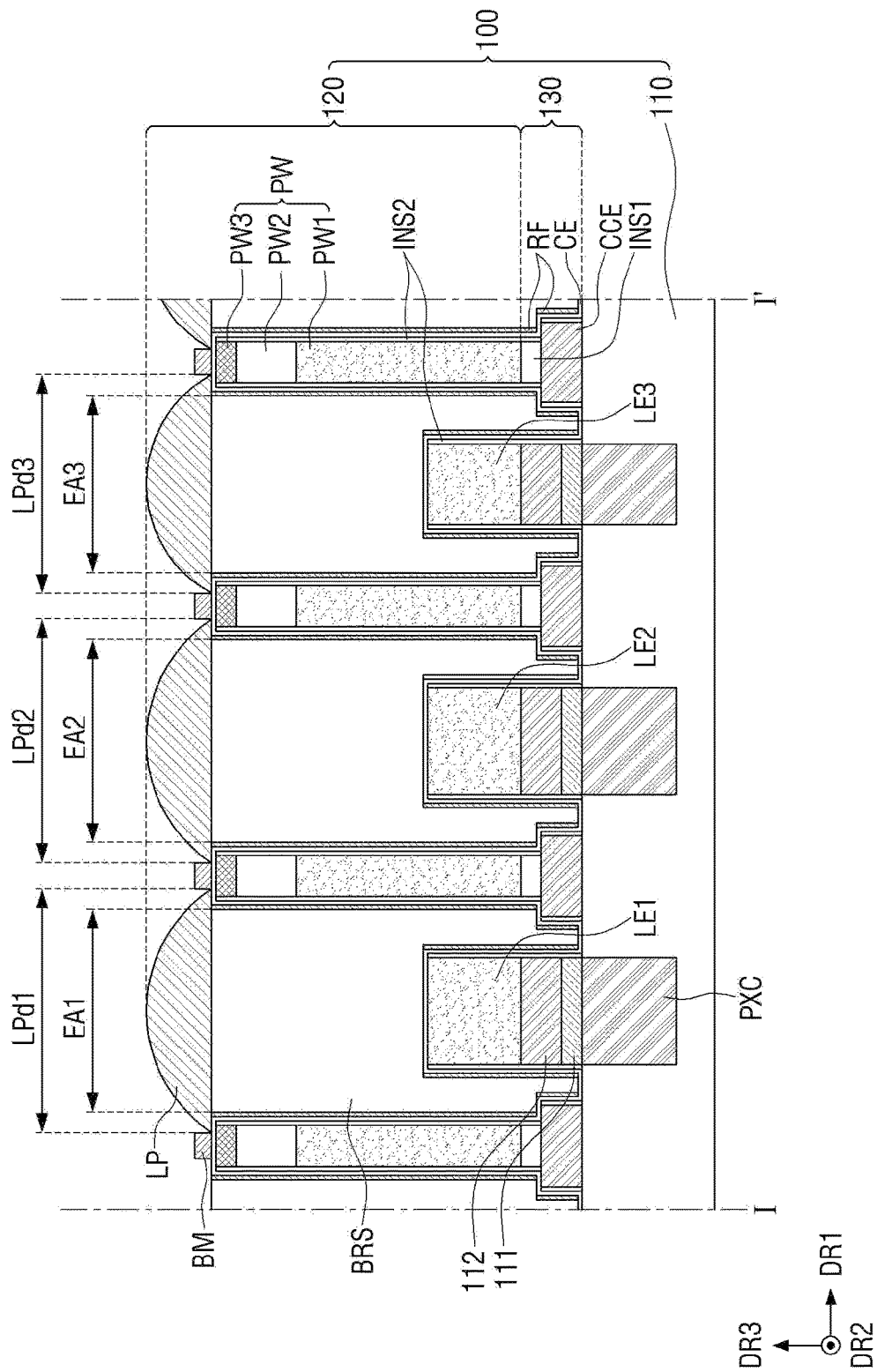
FIG. 13 is a cross-sectional view illustrating an example of a display panel taken along the line I-I' of FIG. 12.

FIG. 12 is a layout view illustrating in detail the pixels shown in the area B of FIG. 2. FIG. 13 is a cross-sectional view illustrating an example of the display panel taken along the line I-I' of FIG. 12.

Referring to FIGS. 12 and 13, each optical pattern LP is disposed on each of the emission areas EA1, EA2, EA3, and EA4, except for the area where the light blocking member is formed on the partition wall PW. Each optical pattern LP may be formed and arranged to be larger than each of the emission areas EA1, EA2, EA3 and EA4 so as to cover all of the emission areas EA1, EA2, EA3 and EA4.

For example, each optical pattern LP may be formed and arranged to have the same or greater planar area than the planar area of each of the emission areas EA1, EA2, EA3, and EA4 so as to fully cover the edges of each of the emission areas EA1, EA2, EA3, and EA4. In this case, the range of settings of each optical pattern LP, such as heights, widths LPd1, LPd2, and LPd3, inclination angles, curvatures, and the like, or a range of modification is widened. Thus, the shape of each optical pattern LP may be modified and applied according to the area of each of the emission areas EA1, EA2, EA3, and EA4, and accordingly, the light concentration efficiency may be improved.

In addition, as shown in FIGS. 12, and 13, the first to fourth emission areas EA1 to EA4 of each pixel PX may be formed to have the same or different sizes or planar areas from each other. For example, the first and second emission areas EA1 and EA2 may have the same size or area as each other, and the third emission area EA3 may have a different size or area from that of the second emission area EA2. The third and fourth emission areas EA3 and EA4 may have the same size or area as each other. Accordingly, the size or area of the optical patterns LP disposed on the first and second emission areas EA1 and EA2 may be different from the size or area of the optical patterns LP disposed on the third and fourth emission areas EA3 and EA4. In addition, the size or planar area of each of the first to fourth light emitting elements LE1 to LE4 respectively formed in the first to fourth emission areas EA1 to EA4 may be the same as or different from each other. That is, as shown in FIG. 12, the sizes or planar areas of the first and second light emitting elements LE1 and LE2 respectively disposed in the first and second emission areas EA1 and EA2 may be different from the sizes or planar areas of the third and fourth light emitting elements LE3 and LE4 respectively disposed in the third and fourth emission areas EA3 and EA4.

In one or more embodiments, the first and second emission areas EA1 and EA2 may have the same size or area as each other, and the size or area of the third emission area EA3 may be formed to be smaller than the size or area of the second emission area EA2. In addition, the third and fourth emission areas EA3 and EA4 may have the same size or area as each other. Accordingly, the sizes or areas of the optical patterns LP respectively disposed on the first and second emission areas EA1 and EA2 may be larger than the sizes or areas of the optical patterns LP respectively disposed on the third and fourth emission areas EA3 and EA4.

The sizes or planar areas of the first and second light emitting elements LE1 and LE2 respectively disposed in the first and second emission areas may be larger than the sizes or planar areas of the third and fourth light emitting elements LE3 and LE4 respectively disposed in the third and fourth emission areas EA3 and EA4.

The first light emitting element LE1 of the first emission area EA1 shown in FIG. 12 may emit a first light in a wavelength range realizing any one of red, green, and blue colors. In addition, the second light emitting element LE2 of the second emission area EA2 may emit a second light in a wavelength range realizing one of red, blue, and green colors, which is different from the color of the first light. On the other hand, the third light emitting element LE3 of the third emission area EA3 may emit a third light in a wavelength range realizing one of red, blue, and green colors, which is different from the colors of the first and second lights. Additionally, the fourth light emitting element LE4 of the fourth emission area EA4 may emit a fourth light in a wavelength range realizing the same color as that of any one of the first to third lights.

Figure 14:
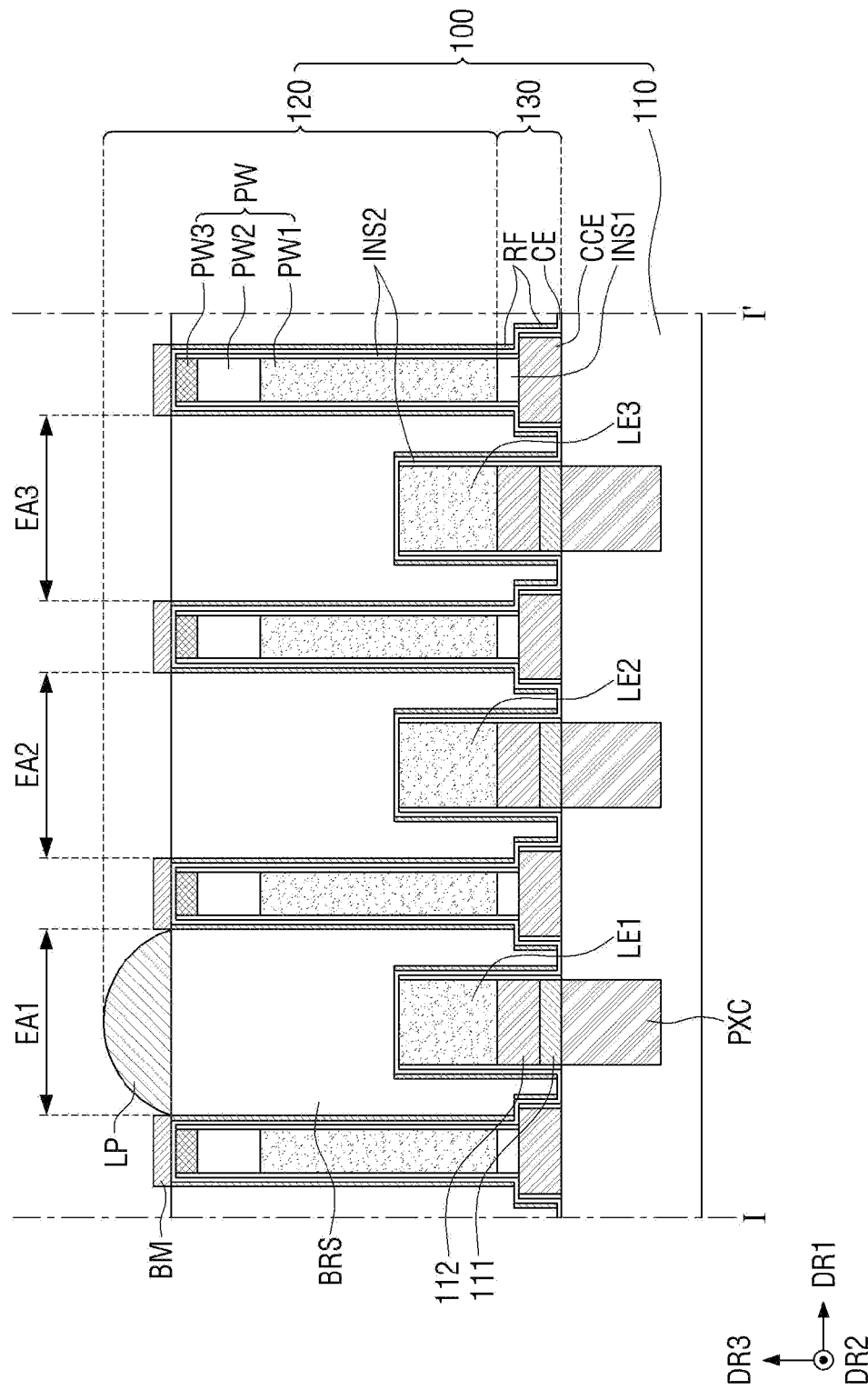
FIG. 14 is a cross-sectional view illustrating an example of the display panel taken along the line I-I' of FIG. 12.

FIG. 14 is a cross-sectional view illustrating an example of the display panel taken along the line I-I' of FIG. 12.

Referring to FIG. 14, each optical pattern LP may be selectively disposed on each of the emission areas EA1, EA2, EA3, and EA4. For example, each of the optical patterns LP may be selectively disposed only on at least one of the emission areas EA1, EA2, EA3, and EA4. For example, when the first emission areas EA1 emit the first light in the red wavelength range, optical patterns LP may each be formed only on the respective first emission areas EA1 to improve the light concentration and emission efficiency of red light with the lowest light extraction efficiency.

In this way, the optical patterns LP respectively disposed in the first emission areas EA1 may condense and emit the first light passing through a base resin BRS of the first emission areas EA1.

Figure 15:
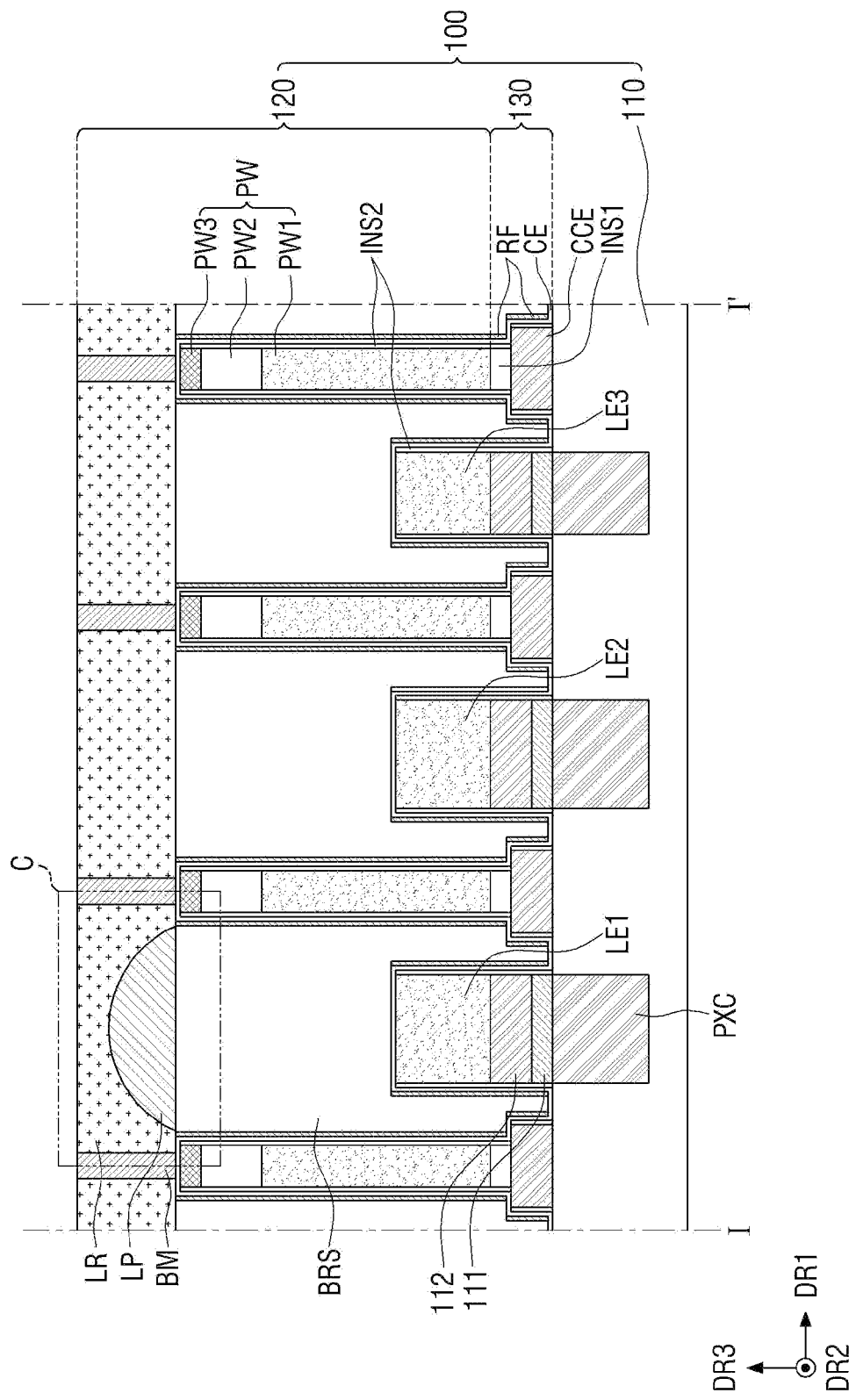
FIG. 15 is a cross-sectional view illustrating an example of the display panel taken along the line I-I' of FIG. 12.
Figure 16:
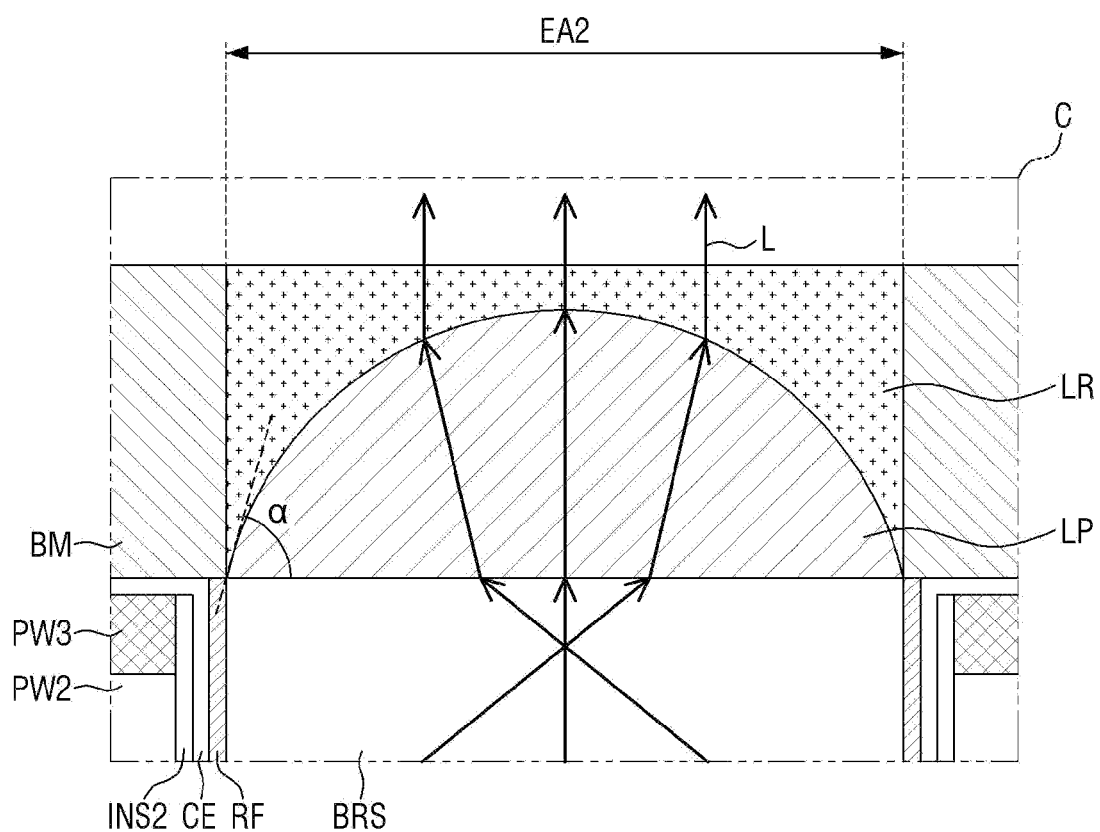
FIG. 16 is an enlarged cross-sectional view of an area C, which is a lens formation area of FIG. 15.

FIG. 15 is a cross-sectional view illustrating an example of the display panel taken along the line I-I' of FIG. 12. FIG. 16 is an enlarged cross-sectional view of an area C, which is a lens formation area of FIG. 15.

Referring to FIGS. 15 and 16, each optical pattern LP may be selectively disposed only on at least one of the first to fourth emission areas EA1, EA2, EA3, and EA4. In addition, a filling member LR covering all of the remaining emission areas EA1, EA2, EA3, and EA4 and each of the selectively disposed optical patterns LP may be further formed.

The refractive index of each optical pattern LP may be greater than that of the base resin BRS, and the refractive index of the filling member LR may be greater than that of the base resin BRS or each optical pattern LP. Because the refractive index of the filling member LR is greater than that of the base resin BRS, the light concentration efficiency may be increased when light travels from the base resin BRS to the filling member LR.

Referring to FIG. 16, in the emission area in which each optical pattern LP is formed, light emitted through the base resin BRS is primarily condensed through each optical pattern LP.

When among the light L transmitted through the base resin BRS, light travels obliquely in the lateral direction having a suitable angle (e.g., a set or predetermined angle) with respect to the upper direction DR3, each optical pattern LP may propagate the traveling light in the lateral direction in which the angle with respect to the upper direction DR3 is reduced (e.g., may condense the light to the central portion of the first emission area EA1). Thereafter, when light is propagated to the filling member LR through each optical pattern LP, the light may be further refracted to the extent of being condensed while passing through the boundary between each optical pattern LP and the filling member LR.

Figure 17:
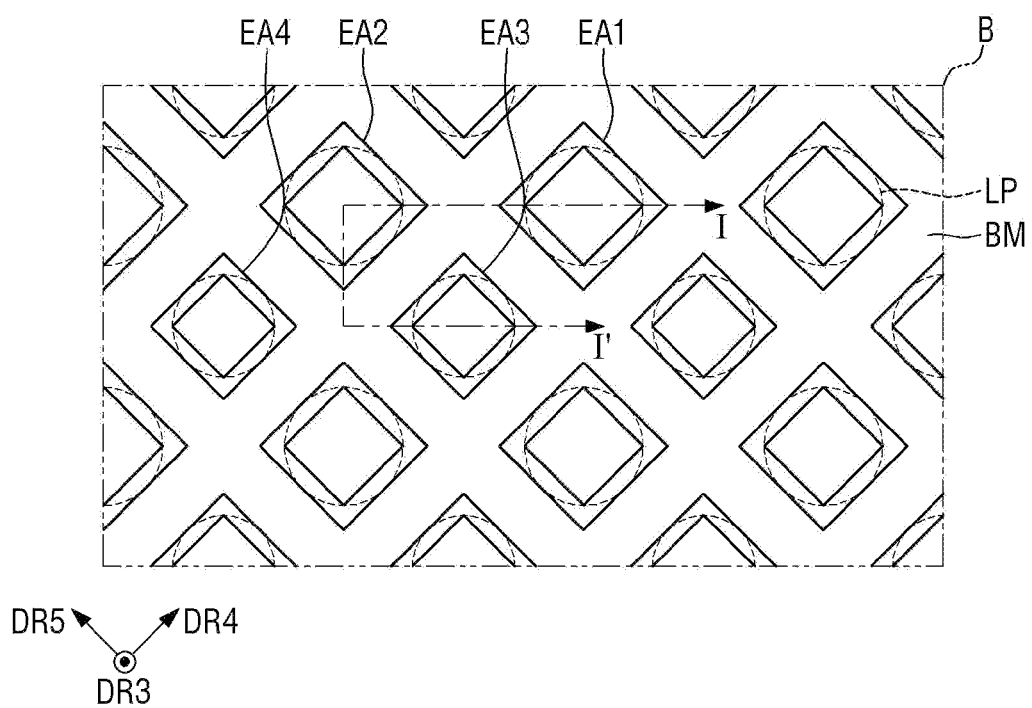
FIG. 17 is a layout view illustrating in detail the pixels shown in the area B of FIG. 2.
Figure 18:
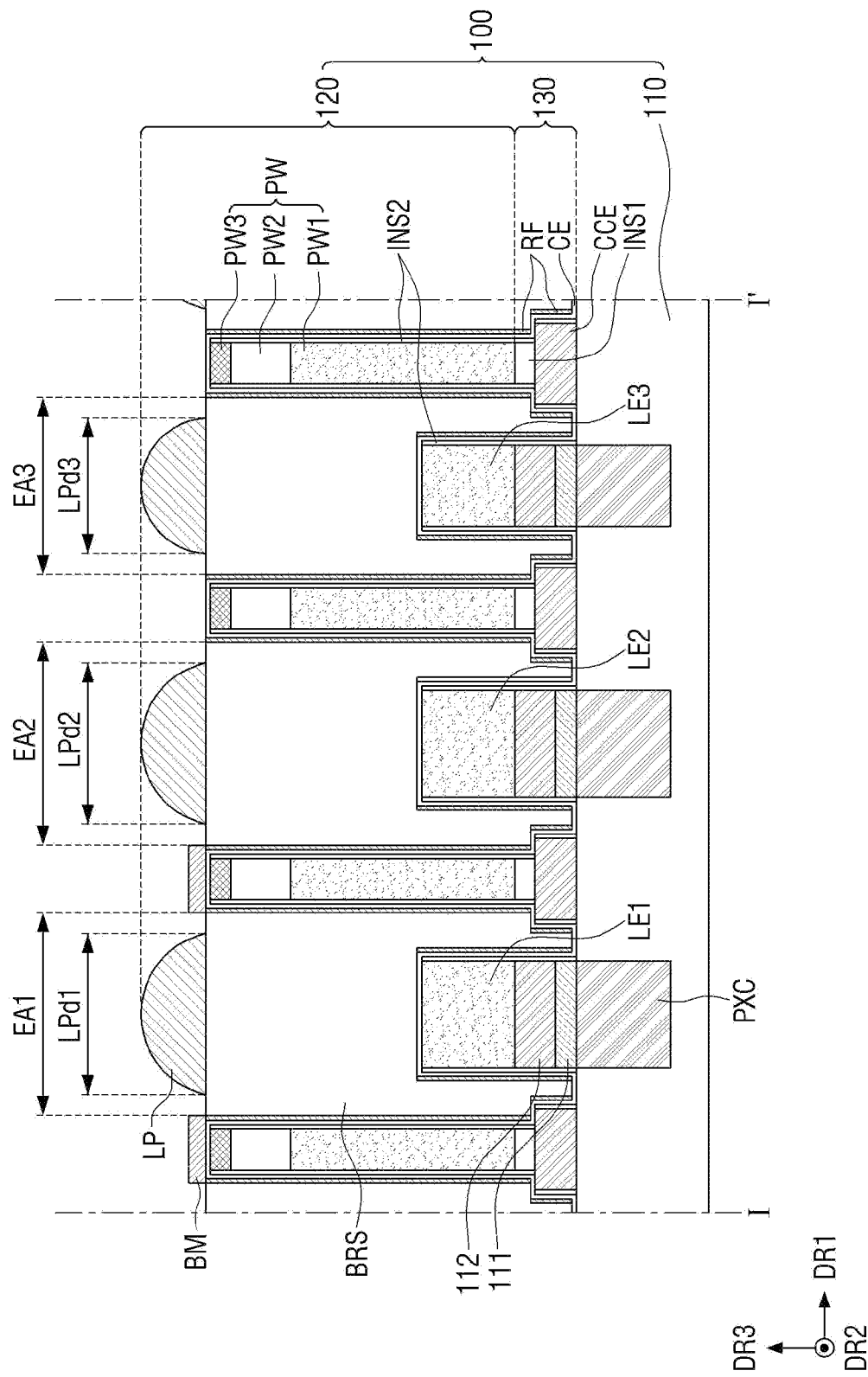
FIG. 18 is a cross-sectional view illustrating an example of a display panel taken along the line I-I' of FIG. 17.

FIG. 17 is a layout view illustrating in detail the pixels shown in the area B of FIG. 2. FIG. 18 is a cross-sectional view illustrating an example of the display panel taken along the line I-I' of FIG. 17.

Referring to FIGS. 17 and 18, each optical pattern LP may be formed and disposed to be smaller than the planar area of each of the emission areas EA1, EA2, EA3, and EA4 so as to cover each of the light emitting elements LE1, LE2, LE3, and LE4 respectively disposed in the emission areas EA1, EA2, EA3, and EA4. In this case, the range of settings of each optical pattern LP, such as the heights, widths LPd1, LPd2, LPd3, inclination angles, and curvatures, is inevitably narrowed, but the light concentration efficiency may be changed and applied by increasing the formation area and height of the light blocking member BM.

FIGS. 19 to 24 are layout views of various embodiments, showing in detail the pixels shown in the area B of FIG. 2.

Figure 19:
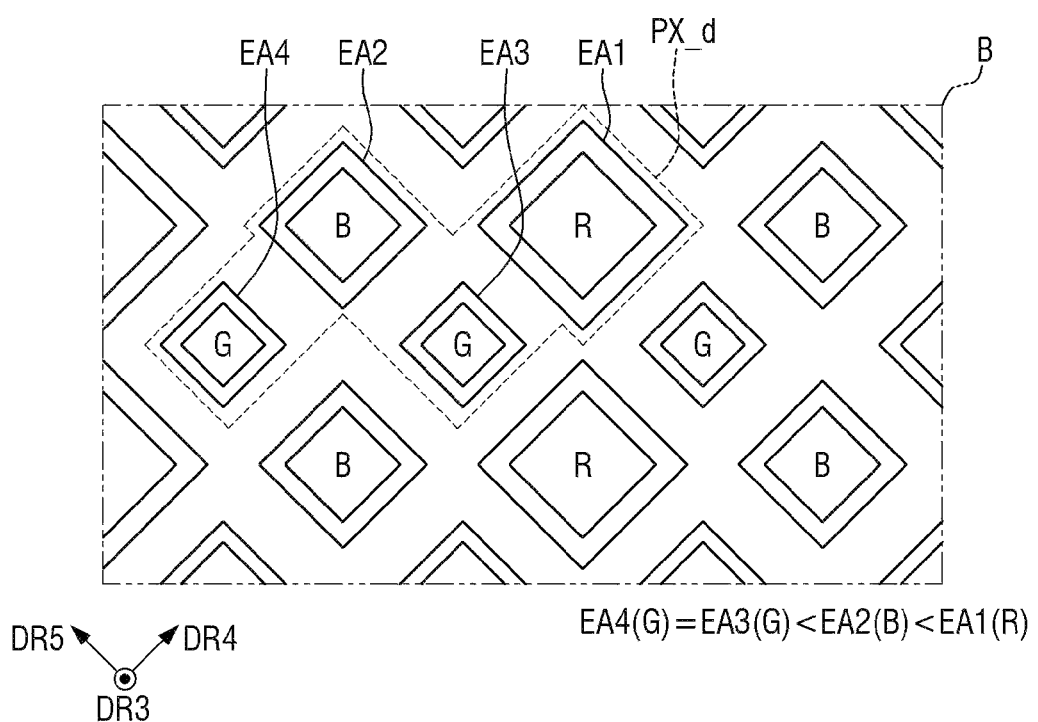
FIGS. 19 to 24 are layout views of various embodiments, showing in detail the pixels shown in the area B of FIG. 2.

Referring to FIG. 19, the size or planar area of each of the first to fourth emission areas EA1 to EA4 of each pixel PX may be the same as or different from each other.

For example, the size or area of the first emission area EA1 may be larger than that of the adjacent second emission area EA2, and the size or area of the second emission area EA2 may be larger than the size or area of the adjacent third emission area EA3. In addition, the size or area of the third and fourth emission areas EA3 and EA4 adjacent to each other may be the same as each other.

The optical pattern LP disposed on the first emission area EA1 may be formed to have a larger size or area than that of the optical pattern LP disposed on the second emission area EA2. In addition, the optical pattern LP disposed on the second emission area EA2 may be formed to have a larger size or area than those of the optical patterns LP disposed on the third and fourth emission areas EA3 and EA4.

The first light emitting element LE1 may be formed to have a larger size or planar area than that of the adjacent second light emitting element LE2 and the second light emitting element LE2 may be formed to have a larger size or planar area than that of the adjacent third light emitting element LE3 according to the area of the size of each of the first to fourth emission areas EA1 to EA4. In addition, the third and fourth light emitting elements LE3 and LE4 may have the same size or planar area.

The first light emitting element LE1 of the first emission area EA1 may emit a first light in a wavelength range realizing a red color. In addition, the second light emitting element LE2 of the second emission area EA2 may emit a second light in a wavelength range realizing a blue color. On the other hand, the third and fourth light emitting elements LE3 and LE4 of the third and fourth emission areas EA3 and EA4 may both emit a third light in a wavelength range realizing a green color. In this way, a red color with the lowest light extraction efficiency is realized through the first light emitting element LE1 of the first emission area EA1 formed to have the largest size or planar area, thereby further improving light extraction efficiency of red color light.

In one or more embodiments, each optical pattern LP may be selectively disposed on at least one of the respective emission areas EA1, EA2, EA3, and EA4, and a filling member LR may be further formed on each of the emission areas EA1, EA2, EA3, and EA4 including each of the selectively disposed optical patterns LP.

Figure 20:
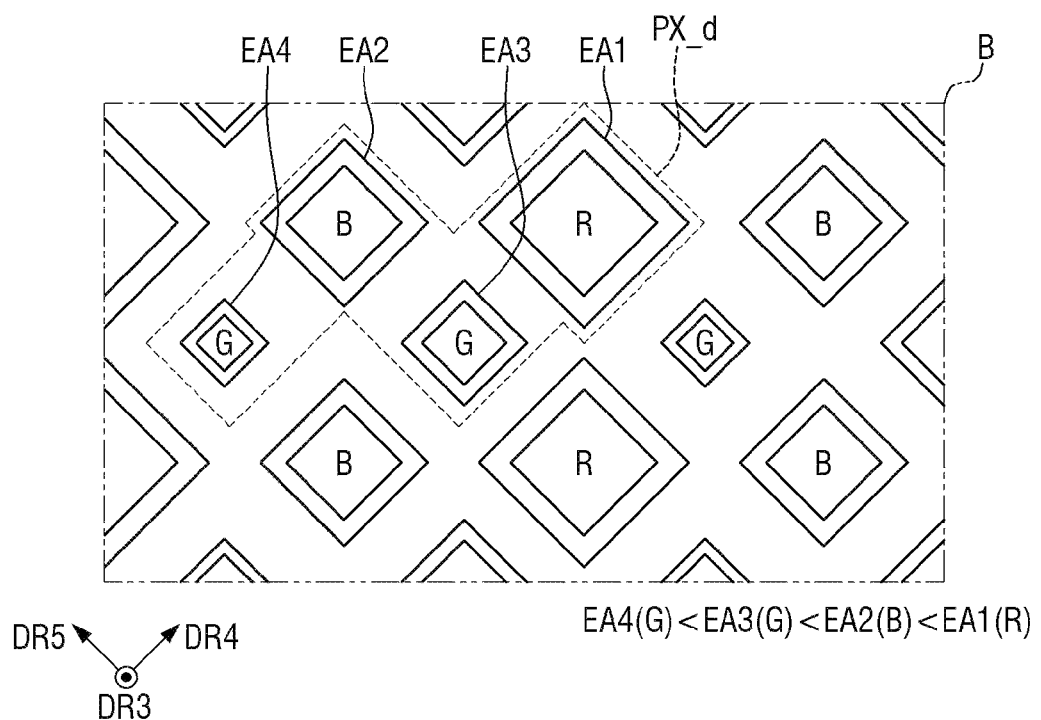

Referring to FIG. 20, the size or area of the first emission area EA1 among the first to fourth emission areas EA1 to EA4 of each pixel PX may be larger than that of the adjacent second emission area EA2. Also, the size or area of the second emission area EA2 may be larger than that of the adjacent third emission area EA3. In addition, the size or area of the third emission area EA3 may be larger than that of the adjacent fourth emission area EA4. Accordingly, the fourth emission area EA4 among the first to fourth emission areas EA1 to EA4 of each pixel PX may have the smallest size or area.

The first light emitting element LE1 may be formed to have a larger size or planar area than that of the adjacent second light emitting element LE2 and the second light emitting element LE2 may be formed to have a larger size or planar area than that of the adjacent third light emitting element LE3 according to the area of the size of each of the first to fourth emission areas EA1 to EA4. In addition, the third light emitting element LE3 may be formed to have a larger size or planar area than that of the fourth light emitting element LE4. Therefore, the fourth light emitting element LE4 among the first to fourth light emitting element LE1 to LE4 of each pixel PX may have the smallest size or area.

The first light emitting element LE1 shown in FIG. 20 may emit a first light in a wavelength range realizing any one of red, green, and blue colors. In addition, the second light emitting element LE2 may emit a second light in a wavelength range realizing one of red, blue, and green colors, which is different from the color of the first light. On the other hand, the third light emitting element LE3 may emit a third light in a wavelength range realizing one of red, blue, and green colors, which is different from the colors of the first and second lights. Additionally, the fourth light emitting element LE4 may emit a fourth light in a wavelength range realizing the same color as that of any one of the first to third lights.

For example, the first light emitting element LE1 of the first emission area EA1 may emit a first light in a wavelength range realizing a red color. In addition, the second light emitting element LE2 of the second emission area EA2 may emit a second light in a wavelength range realizing a blue color. On the other hand, the third and fourth light emitting elements LE3 and LE4 of the third and fourth emission areas EA3 and EA4 may both emit a third light in a wavelength range realizing a green color.

As described above, each optical pattern LP may be selectively disposed on at least one of the respective emission areas EA1, EA2, EA3, and EA4, and the filling member LR may be further formed on each of the emission areas EA1, EA2, EA3, and EA4 including each of the selectively disposed optical patterns LP.

Figure 21:
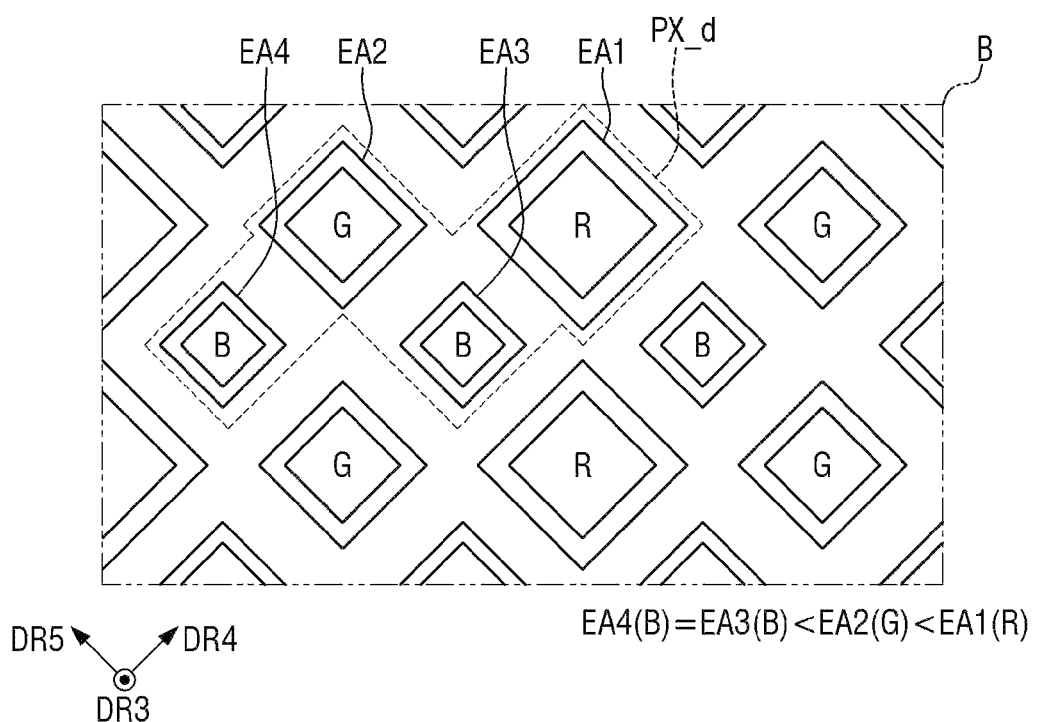

Referring to FIG. 21, the size or area of the first emission area EA1 may be larger than that of the adjacent second emission area EA2, and the size or area of the second emission area EA2 may be larger than that of the adjacent third emission area EA3. In addition, the size or area of the third and fourth emission areas EA3 and EA4 adjacent to each other may be the same as each other.

The first light emitting element LE1 may be formed to have a larger size or planar area than that of the adjacent second light emitting element LE2 and the second light emitting element LE2 may be formed to have a larger size or planar area than that of the adjacent third light emitting element LE3 In addition, the third and fourth light emitting elements LE3 and LE4 may have the same size or planar area.

The first light emitting element LE1 may emit a first light in a wavelength range realizing any one of red, green and blue colors. In addition, the second light emitting element LE2 may emit a second light in a wavelength range realizing one of red, blue, and green colors, which is different from the color of the first light. On the other hand, the third light emitting element LE3 may emit a third light in a wavelength range realizing one of red, blue, and green colors, which is different from the colors of the first and second lights. Additionally, the fourth light emitting element LE4 may emit a fourth light in a wavelength range realizing the same color as that of any one of the first to third lights. For example, the first light emitting element LE1 may emit a first light in a wavelength range realizing a red color. In addition, the second light emitting element LE2 may emit a third light in a wavelength range realizing a green color. On the other hand, the third and fourth light emitting elements LE3 and LE4 of the third and fourth emission areas may both emit a second light in a wavelength range realizing a blue color.

Figure 22:
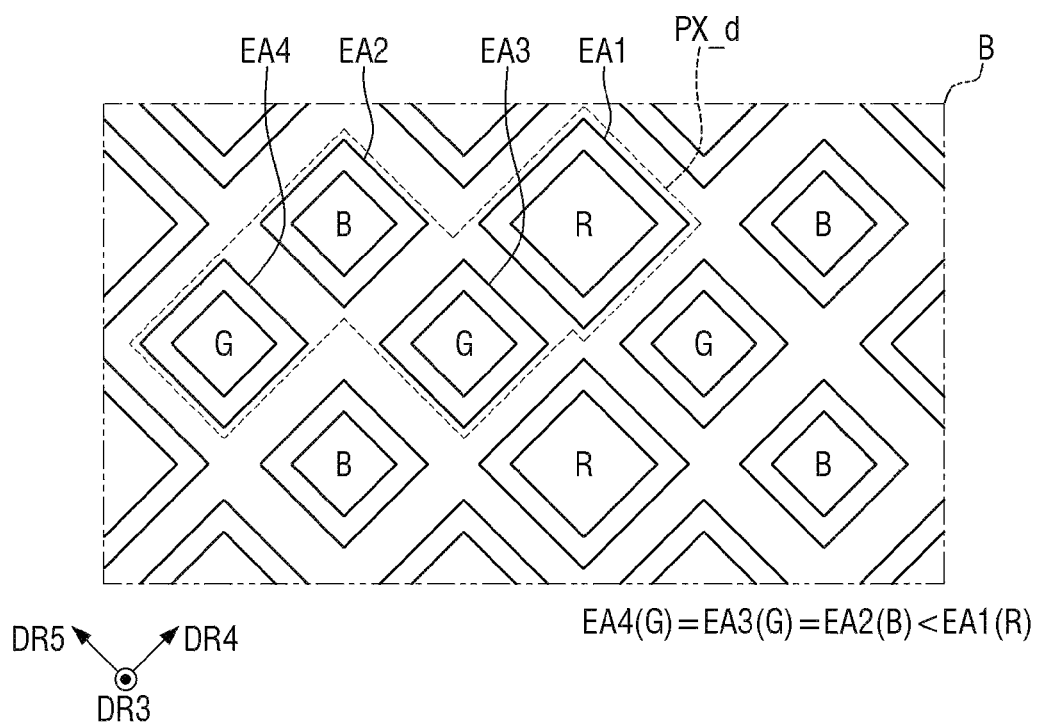

Referring to FIG. 22, the size or area of the first emission area EA1 among the first to fourth emission areas EA1 to EA4 of each pixel PX may be larger than that of the adjacent second emission area EA2. In addition, the sizes or areas of the second to fourth emission areas EA2 to EA4 may be the same.

The first light emitting element LE1 may be formed to have a larger size or planar area than that of the adjacent second light emitting element LE2 and the second to fourth light emitting elements LE2 to LE4 may be formed to have the same size or planar area.

The first light emitting element LE1 of the first emission area EA1 may emit a first light in a wavelength range realizing a red color. In addition, the second light emitting element LE2 of the second emission area EA2 may emit a second light in a wavelength range realizing a blue color. On the other hand, the third and fourth light emitting elements LE3 and LE4 of the third and fourth emission areas EA3 and EA4 may both emit a third light in a wavelength range realizing a green color.

As described above, each optical pattern LP may be selectively disposed on the first emission areas EA1 that realize a red color with the lowest light extraction efficiency among the respective emission areas EA1, EA2, EA3, and EA4, and a filling member LR may be further formed on each of the emission areas EA1, EA2, EA3, EA4 including each of the selectively disposed optical patterns LP.

Figure 23:
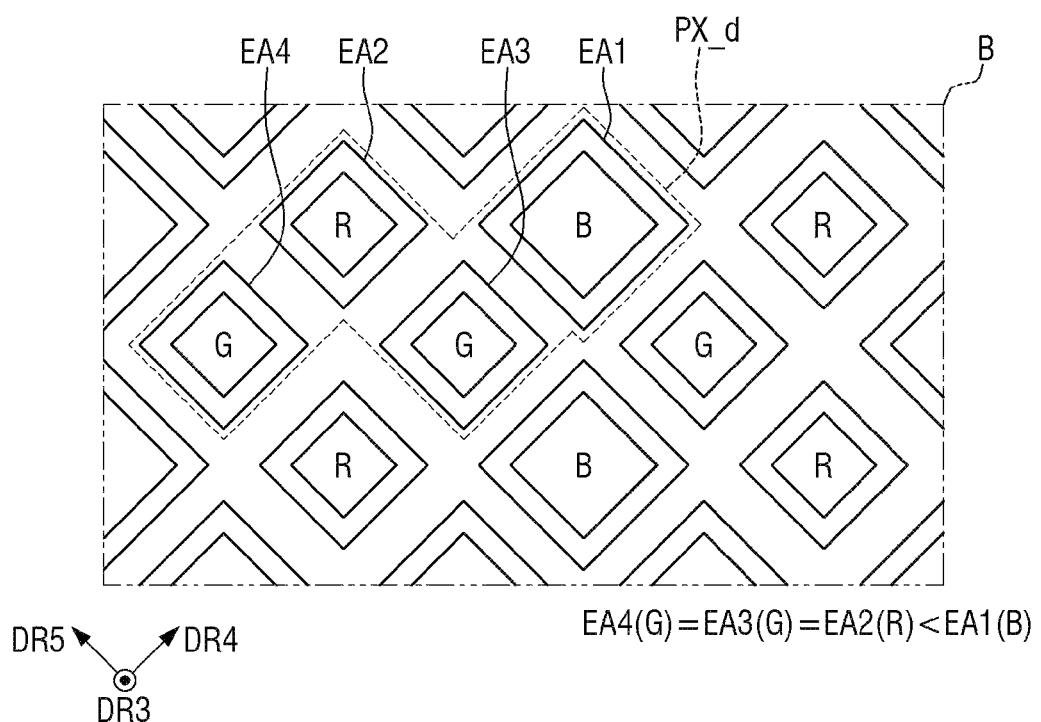

Referring to FIG. 23, the size or area of the first emission area EA1 among the first to fourth emission areas EA1 to EA4 of each pixel PX may be larger than that of the adjacent second emission area EA2. In addition, the sizes or areas of the second to fourth emission areas EA2 to EA4 may be the same. Accordingly, the first light emitting element LE1 may be formed to have a larger size or planar area than that of the adjacent second light emitting element LE2 and the second to third light emitting elements LE2 to LE3 may be formed to have the same size or planar area.

The first light emitting element LE1 of the first emission area EA1 may emit a second light in a wavelength range realizing a blue color. In addition, the second light emitting element LE2 of the second emission area EA2 may emit a first light in a wavelength range realizing a red color. On the other hand, the third and fourth light emitting elements LE3 and LE4 of the third and fourth emission areas EA3 and EA4 may both emit a third light in a wavelength range realizing a green color. Likewise, each optical pattern LP may be selectively disposed on the second emission areas EA2 that realize a red color with the lowest light extraction efficiency among the respective emission areas EA1, EA2, EA3, and EA4, and a filling member LR may be further formed on each of the emission areas EA1, EA2, EA3, EA4 including each of the selectively disposed optical patterns LP.

Figure 24:
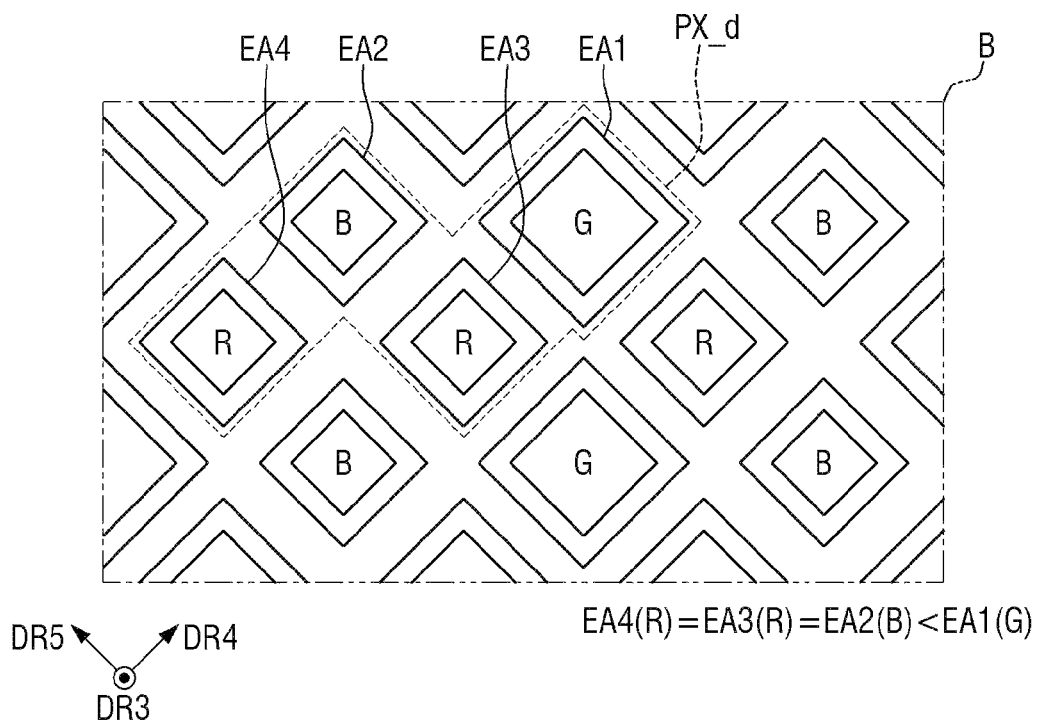

Referring to FIG. 24, the size or area of the first emission area EA1 among the first to fourth emission areas EA1 to EA4 of each pixel PX may be larger than that of the adjacent second emission area EA2. In addition, the sizes or areas of the second to fourth emission areas EA2 to EA4 may be the same.

The first light emitting element LE1 of the first emission area EA1 may emit a third light in a wavelength range realizing a green color. In addition, the second light emitting element LE2 of the second emission area EA2 may emit a second light in a wavelength range realizing a blue color. On the other hand, the third and fourth light emitting elements LE3 and LE4 of the third and fourth emission areas EA3 and EA4 may both emit a first light in a wavelength range realizing a red color. A red color with the lowest light extraction efficiency is realized through the third and fourth light emitting elements LE3 and LE4, thereby further improving light extraction efficiency of red color light.

In addition, each optical pattern LP may be selectively disposed on the third and fourth light emitting elements LE3 and LE4 that realize a red color with the lowest light extraction efficiency, and a filling member LR may be further formed on each of the emission areas EA1, EA2, EA3, EA4 including each of the selectively disposed optical patterns LP.

Figure 25:
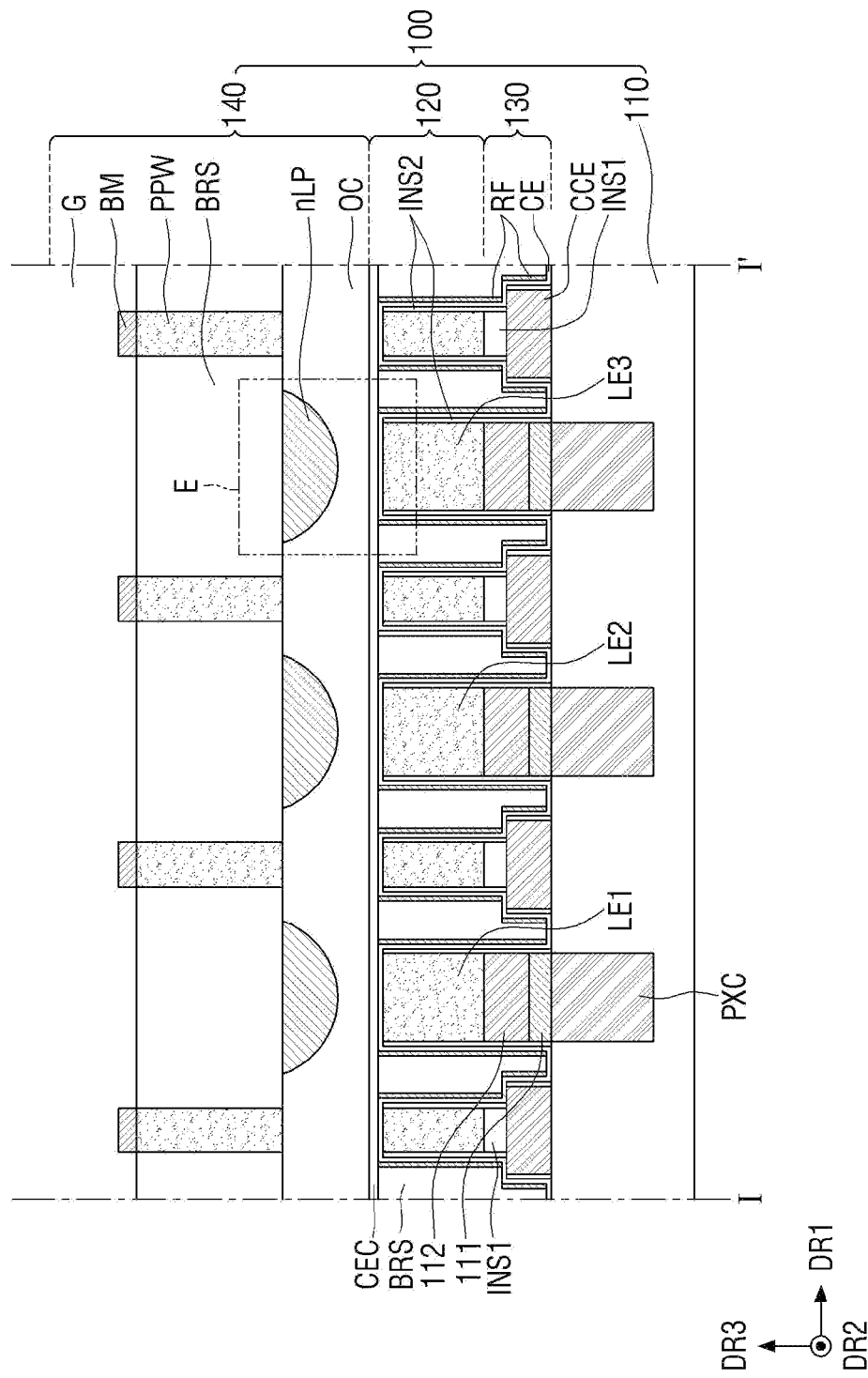
FIG. 25 is a cross-sectional view illustrating an embodiment of the display panel taken along the line I-I' of FIG. 3.

FIG. 25 is a cross-sectional view illustrating an embodiment of the display panel taken along the line I-I' of FIG. 3;

Referring to FIG. 25, the display panel 100 may include the semiconductor circuit board 110, the conductive connection layer 130, the light emitting element layer 120, and an optical pattern layer 140.

The semiconductor circuit board 110 may include a plurality of pixel circuit units PXC and pixel electrodes 111. The conductive connection layer 130 may include connection electrodes 112, first pads PD1, a common connection electrode CCE, and a first insulating layer INS1.

A protective layer CEC capable of protecting the light emitting elements LE1, LE2, and LE3 of the light emitting element layer 120 and enhancing hardness may be further formed on the front surface of the conductive connection layer 130 including the light emitting element layer 120. The protective layer CEC may be formed of undoped GaN or InGaN.

The optical pattern layer 140 includes transparent glass G, a plurality of light blocking walls PPW formed in regions corresponding to the partition wall PW of the light emitting element layer 120, light blocking member BM disposed on each of the light blocking walls PPW, and a base resin BRS filled in areas between the light blocking walls PPW which are front surface areas corresponding to each of the light emission areas EA1, EA2, EA3, and EA4. In addition, the optical pattern layer 140 further includes a plurality of inner optical patterns nLP disposed on a front surface of each of the emission areas EA1, EA2, EA3, and EA4 and an adhesive member OC formed to have adhesiveness between the plurality of inner optical patterns nLP and each of the emission areas EA1, EA2, EA3, and EA4.

The adhesive member OC is formed between the light emitting element layer 120 and the optical pattern layer 140 so that the optical pattern layer 140 can be fixed and adhered to the front surface area of the light emitting element layer 120. The adhesive member OC may be formed of an optically clear resin (OCR), optically clear adhesive (OCA), or the like. The adhesive member OC has a lower refractive index than that of the plurality of inner optical patterns nLP.

The adhesive member OC of the optical pattern layer 140 and the plurality of inner optical patterns nLP formed on the adhesive member OC condense the light emitted from each of the light emission areas EA1, EA2, EA3, and EA4 and emit the condensed light to the base resin BRS filled in the areas between the light blocking walls PPW. In other words, the optical pattern layer 140 allows the light emitted from the light emitting elements LE1, LE2, and LE3 to be condensed in a direction in which the base resin BRS is formed, without being scattered in the upper portion of each of the emission areas EA1, EA2, EA3, and EA4, and may be output to the outside.

In one or more embodiments, each of the inner optical patterns nLP may be selectively disposed on each of the emission areas EA1, EA2, EA3, and EA4. In one or more embodiments, each of the inner optical patterns nLP may be disposed directly on the base resin BRS of each of the light emission areas EA1, EA2, EA3, and EA4. The inner optical patterns nLP may have a shape protruding in a downward direction (e.g., in a direction toward the light emitting elements LE1 to LE4). For example, the inner optical patterns nLP may be formed and disposed to have a cross section in the shape of a converging lens which is horizontally attached in the direction of the base resin BRS and protrudes in the direction toward the light emitting elements LE1 to LE4. The inner optical patterns nLP may be disposed on the front surfaces of the light emitting elements LE1 to LE4 by the adhesive member OC while being covered by the adhesive member OC. The width of the inner optical patterns nLP may be equal to, greater than, or smaller than the width of each of the emission areas EA1, EA2, EA3, and EA4. Accordingly, the inner optical patterns nLP allows the light emitted to the upper portion of each of the emission areas EA1, EA2, EA3, and EA4 to be condensed in the direction of the base resin BRS without being scattered.

The refractive index of the inner optical patterns nLP is greater than the refractive index of the adhesive member OC, so that the light emitted from each of the emission areas EA1, EA2, EA3, EA4 can be refracted to the extent that it is condensed while passing through the boundary between the adhesive member OC and the inner optical patterns nLP.

The base resin BRS formed on the optical pattern layer may further include a scatterer for scattering the light, incident through the inner optical patterns nLP, in a random direction. In this case, the scatterer may include metal oxide particles or organic particles. For example, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). In addition, the organic particles may include an acrylic-based resin or an urethane-based resin. The diameter of the scatterers may be several to several tens of nanometers.

Figure 26:
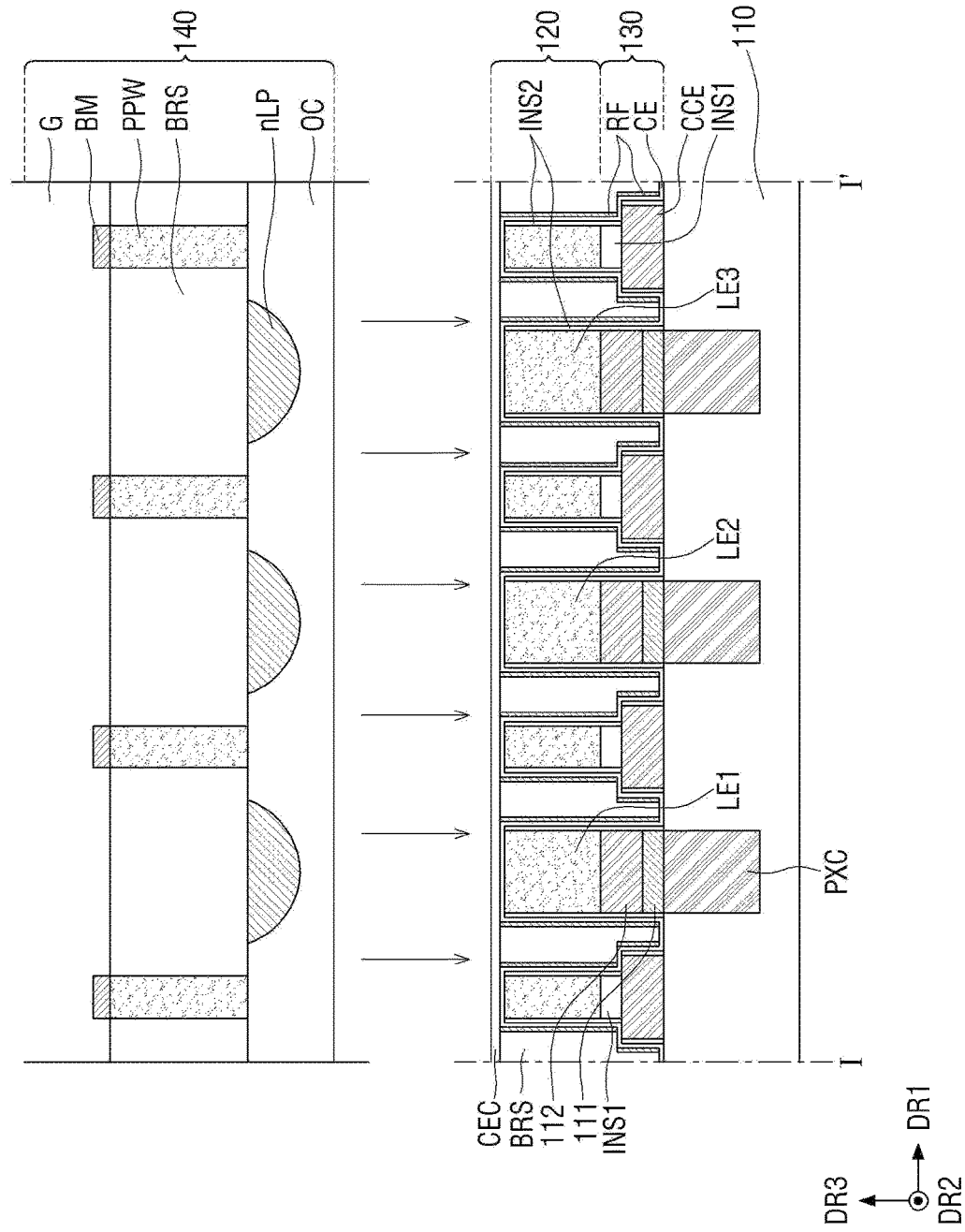
FIG. 26 is a cross-sectional view for explaining a method of bonding the display panel shown in FIG. 25.

FIG. 26 is a cross-sectional view for explaining a method of bonding the display panel shown in FIG. 25.

Referring to FIG. 26, the conductive connection layer 130 and the light emitting element layer 120 may be formed on the semiconductor circuit board 110, and the optical pattern layer 140 may be separately formed on the transparent glass G. In addition, the display panel 100 may be manufactured in such a way that the optical pattern layer 140 faces (or opposes) and adheres to the front surface of the light emitting element layer 120 of the semiconductor circuit board 110.

For example, the conductive connection layer 130 and the light emitting element layer 120 may be formed on the semiconductor circuit board 110, and the protective layer CEC capable of protecting the light emitting elements LE1, LE2, and LE3 of the light emitting element layer 120 and enhancing hardness may be further formed on a front surface of the conductive connection layer 130 including the light emitting element layer 120.

On the other hand, in the separate transparent glass G, a plurality of light blocking members BM are formed in regions respectively corresponding to the partition wall PW of the light emitting element layer 120, and a plurality of light blocking walls PPW may be formed in regions corresponding to the respective light blocking members BM. Accordingly, each light blocking wall PPW may be disposed in a region corresponding to the partition wall PW of the light emitting element layer 120.

The base resin BRS is filled in the areas between the light blocking walls PPW that is a front surface area corresponding to each of the emission areas EA1, EA2, EA3, and EA4. The base resin BRS may selectively include metal oxide particles or organic particles.

A plurality of inner optical patterns nLP are disposed in the areas where the base resin BRS is formed. Each inner optical pattern nLP may have a flat surface adhered to the base resin BRS and be disposed in a converging lens shape protruding in a direction opposite to the transparent glass G. The adhesive member OC is applied and formed on the front surfaces of the base resin BRS including the plurality of inner optical patterns nLP and the light blocking walls PPW so that the optical pattern layer 140 can be fixed and adhered.

Accordingly, the optical pattern layer 140 may be adhered and settled onto the front surface of the semiconductor circuit board 110, while facing (or opposing) each other, by the adhesive member OC, the semiconductor circuit board 110 having the conductive connection layer 130 and the light emitting element layer 120 formed thereon.

Figure 27:
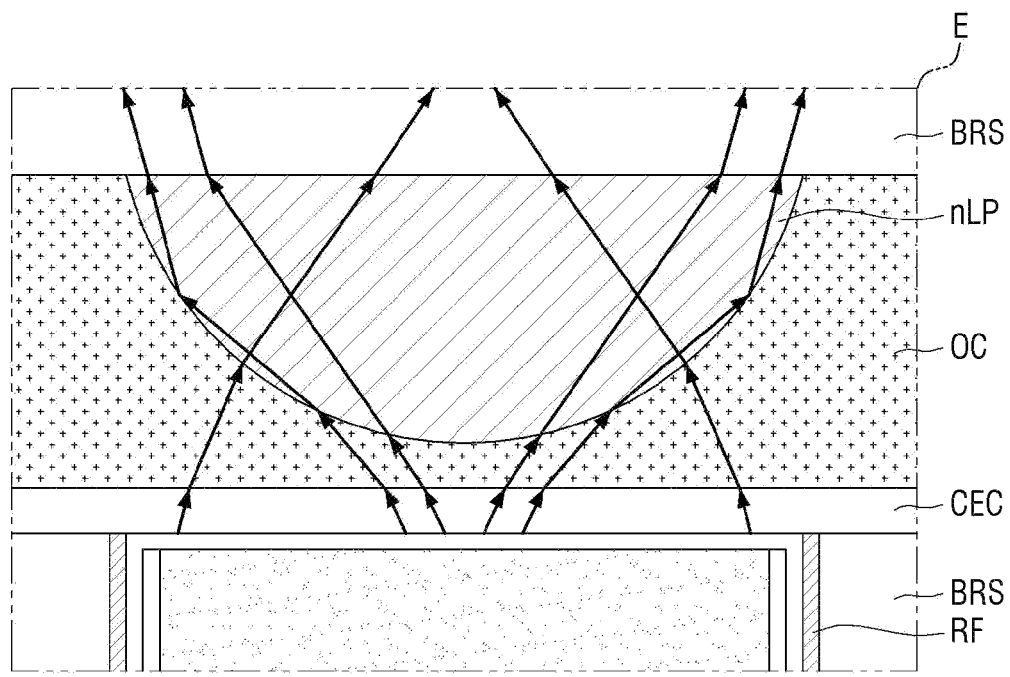
FIG. 27 is an enlarged cross-sectional view of an area E, which is an inner lens formation area of FIG. 25.

FIG. 27 is an enlarged cross-sectional view of an area E, which is an inner lens formation area of FIG. 25;

Referring to FIG. 27, the light emitted from the light emitting elements LE1 to LE4 of the emission areas EA1, EA2, EA3, and EA4 is primarily condensed through the protective layer CEC, and is refracted while passing through each inner optical pattern nLP. Then, the light is secondarily condensed through the adhesive member OC as well as each inner optical pattern nLP and then is emitted to the base resin BRS.

As shown in Table 1 below, the protective layer CEC has the lowest light transmittance and may have a higher refractive index than that of the adhesive member OC or the inner optical pattern nLP. In addition, the adhesive member OC has a lower refractive index than that of the plurality of inner optical patterns nLP.

TABLE 1

|  | Refractive Index | Optimal Refractive Index |
| --- | --- | --- |
| Lens | 1.8 (High) | 2.4 (1.8 ↑ or more) |
| OC | 1.5 (Low) | 1.1 (1.5 ↓ or less) |
| Un-GaN | 2.4 ↑ (High) | Same as left |

Accordingly, light that obliquely travels in the lateral direction of the inner optical pattern nLP among the light scattered from the protection layer CEC, i.e., the light passing through the protective layer CEC, may be condensed in the direction of the adhesive member OC and the base resin BRS in which an angle is reduced. When light travels to the base resin BRS through each inner optical pattern nLP, it may be further refracted to the extent that it is condensed while passing through the boundary between each inner optical pattern nLP and the base resin BRS.

Figure 28:
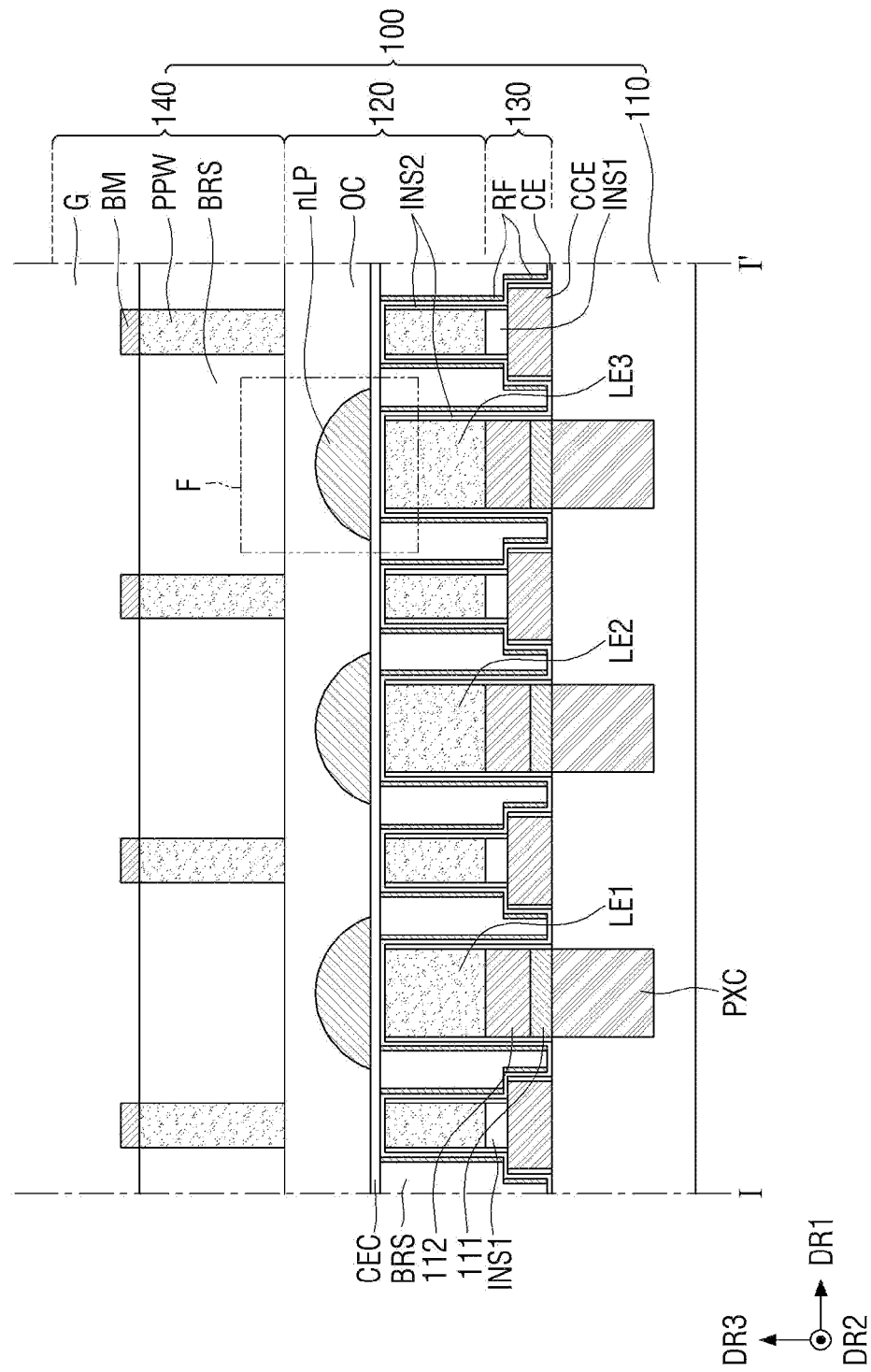
FIG. 28 is a cross-sectional view illustrating an embodiment of the display panel taken along the line I-I' of FIG. 3.

FIG. 28 is a cross-sectional view illustrating an embodiment of the display panel taken along the line I-I' of FIG. 3;

Referring to FIG. 28, the display panel 100 includes a semiconductor circuit board 110, a conductive connection layer 130, a light emitting element layer 120 including a plurality of inner optical patterns nLP and an adhesive member OC, and an optical pattern layer 140 configured to condense light through the base resin BRS and output the condensed light to the outside.

A protective layer CEC capable of protecting the light emitting elements LE1, LE2, and LE3 of the light emitting element layer 120 and enhancing hardness may be further formed on the front surface of the conductive connection layer 130 including the light emitting element layer 120. The protective layer CEC may be formed of undoped GaN or InGaN. In addition, a plurality of inner optical patterns nLP may be selectively formed on the protective layer CEC corresponding to the formation areas of the light emitting elements LE1, LE2, and LE3, and the adhesive member OC is formed to cover all of the inner optical patterns nLP. That is, the adhesive member OC is formed on the front surface area of the light emitting element layer 120 so that the optical pattern layer 140 can be fixed and adhered to the front surface area of the light emitting element layer 120 including each of the inner optical patterns nLP. Here, the adhesive member OC has a lower refractive index than that of the plurality of inner optical patterns nLP.

The optical pattern layer 140 includes transparent glass G, a plurality of light blocking walls PPW formed in regions corresponding to the partition wall PW of the light emitting element layer 120, light blocking member BM disposed on each of the light blocking walls PPW, and a base resin BRS filled in areas between the light blocking walls PPW that are front surface areas corresponding to each of the light emission areas EA1, EA2, EA3, and EA4.

The plurality of inner optical patterns nLP formed on the front surface of the light emitting element layer 120 condense the light emitted from each of the light emission areas EA1, EA2, EA3, EA4 and emit the condensed light to the base resin BRS filled in the areas between the light blocking walls PPW. Accordingly, the optical pattern layer 140 allows the light emitted from the light emitting elements LE1, LE2, and LE3 to be condensed in a direction in which the base resin BRS is formed, without being scattered in the upper portion of each of the emission areas EA1, EA2, EA3, and EA4, and may be output to the outside.

Each of the inner optical patterns nLP may be selectively disposed on each of the emission areas EA1, EA2, EA3, and EA4. The inner optical patterns nLP may have a shape protruding in the upper direction (e.g., in a direction toward the optical pattern layer 140). For example, the inner optical patterns nLP may be formed and disposed to have a cross section in the shape of a converging lens which is horizontally attached in the direction of the protective layer CEC and protrudes in the direction toward the optical pattern layer 140. The inner optical patterns nLP may be disposed on the front surfaces of the light emitting elements LE1 to LE4 by the adhesive member OC while being covered by the adhesive member OC. The width of the inner optical patterns nLP may be equal to, greater than, or smaller than the width of each of the emission areas EA1, EA2, EA3, and EA4. Accordingly, the inner optical patterns nLP allows the light emitted to the upper portion of each of the emission areas EA1, EA2, EA3, and EA4 to be condensed in the direction of the base resin BRS without being scattered.

The refractive index of the inner optical patterns nLP is greater than the refractive index of the adhesive member OC, so that the light emitted from each of the emission areas EA1, EA2, EA3, EA4 can be refracted to the extent that it is condensed while passing through the boundary between the adhesive member OC and the inner optical patterns nLP.

Figure 29:
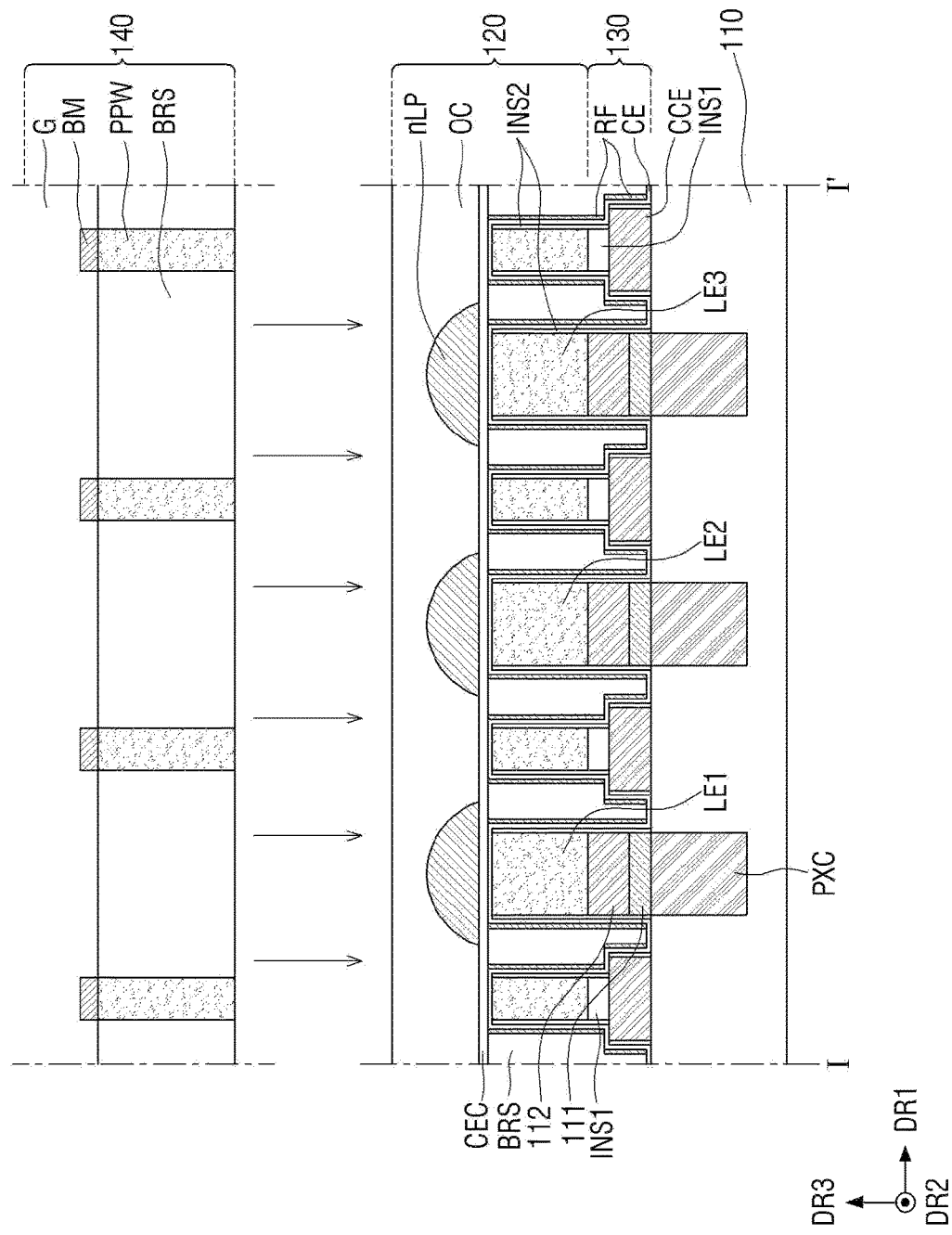
FIG. 29 is a cross-sectional view for explaining a method of bonding the display panel shown in FIG. 28.

FIG. 29 is a cross-sectional view for explaining a method of bonding the display panel shown in FIG. 28.

Referring to FIG. 29, a conductive connection layer 130 and a light emitting element layer 120 including inner optical patterns nLP may be formed on a semiconductor circuit board 110, and an optical pattern layer 140 may be separately formed on transparent glass G. In addition, the display panel 100 may be manufactured in such a way that the optical pattern layer 140 faces (or opposes) and adheres to the front surface of the light emitting element layer 120 of the semiconductor circuit board 110.

For example, the conductive connection layer 130 and the light emitting element layer 120 may be formed on the semiconductor circuit board 110, and the protective layer CEC capable of protecting the light emitting elements LE1, LE2, and LE3 of the light emitting element layer 120 and enhancing hardness may be further formed on a front surface of the conductive connection layer 130 including the light emitting element layer 120. In addition, a plurality of inner optical patterns nLP are disposed on the front surface of the protective layer CEC to correspond to the light emitting elements LE1, LE2, and LE3. Each inner optical pattern nLP may have a flat surface adhered to the protective layer CEC and may be disposed in a converging lens shape protruding in a direction of the optical pattern layer 140. An adhesive member OC is applied and formed on the front surface of the protective layer CEC including the plurality of inner optical patterns nLP so as to be adhered to the optical pattern layer 140.

On the other hand, in the separate transparent glass G, a plurality of light blocking members BM are formed in regions respectively corresponding to the partition wall PW of the light emitting element layer 120, and a plurality of light blocking walls PPW may be formed in regions corresponding to the respective light blocking members BM. Accordingly, each light blocking wall PPW may be disposed in a region corresponding to the partition wall PW of the light emitting element layer 120. The base resin BRS is filled in the areas between the light blocking walls PPW that is a front surface area corresponding to each of the emission areas EA1, EA2, EA3, and EA4. The base resin BRS may selectively include metal oxide particles or organic particles. Accordingly, the optical pattern layer 140 may be adhered and settled onto the front surface of the light emitting element layer, while facing (or opposing) each other, by the adhesive member OC, the light emitting element layer 120 having the plurality of inner optical patterns nLP and the adhesive member OC formed thereon.

Figure 30:
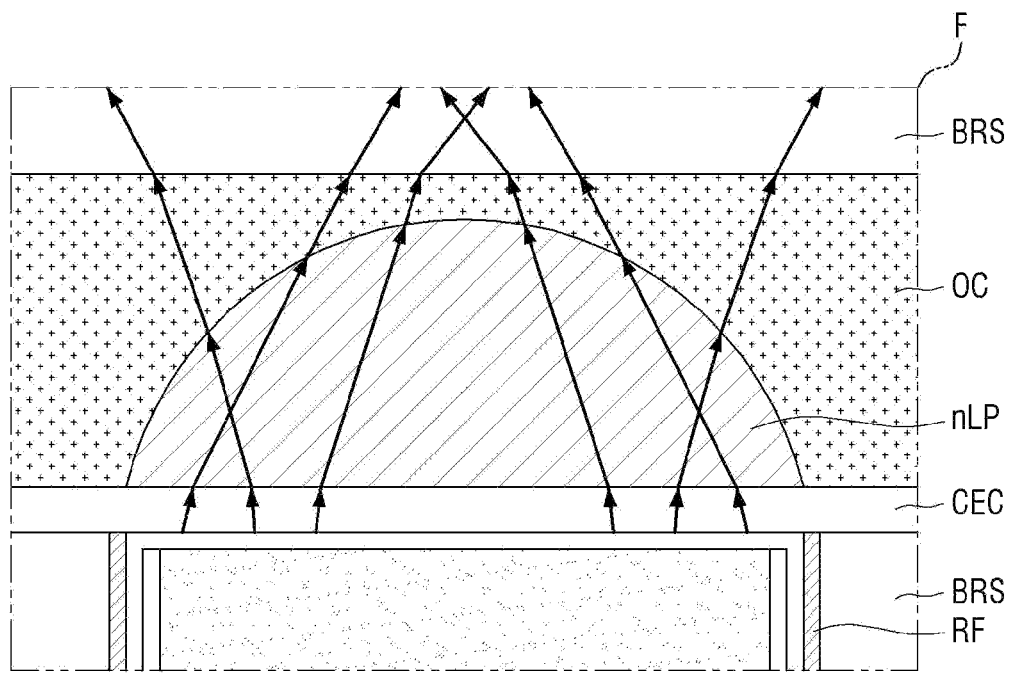
FIG. 30 is an enlarged cross-sectional view of an area F, which is an inner lens formation area of FIG. 28.
Figure 31:
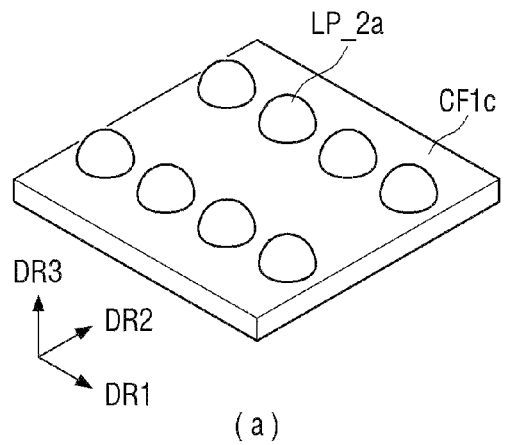
FIGS. 31(a) to 31(e) are perspective views of various modifications of optical patterns.
Figure 31:
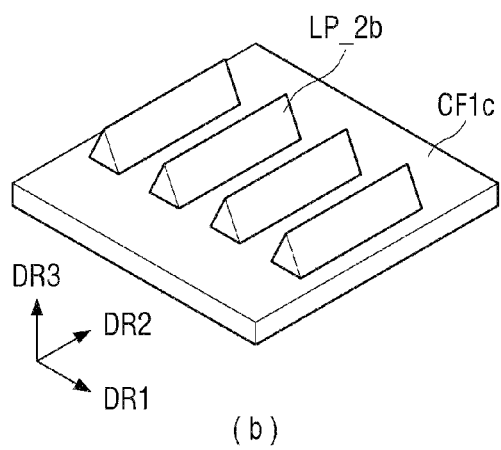
Figure 31:
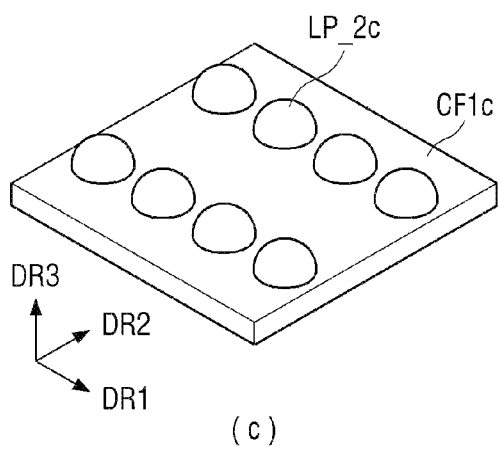
Figure 31:
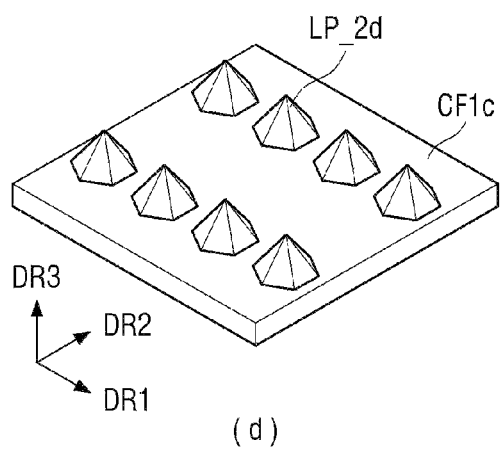
Figure 31:
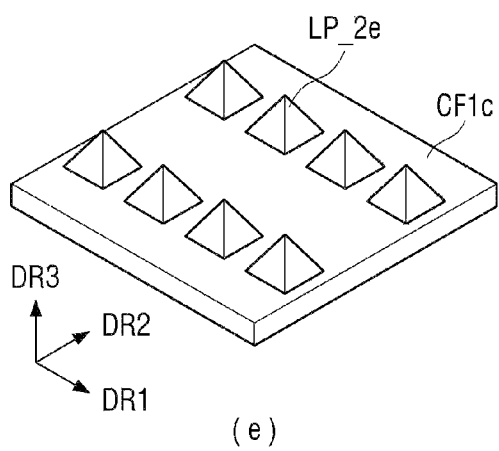

FIG. 30 is an enlarged cross-sectional view of an area F, which is an inner lens formation area of FIG. 28.

Referring to FIG. 30, the light emitted from the light emitting elements LE1 to LE4 of the emission areas EA1, EA2, EA3, and EA4 is primarily condensed through the protective layer CEC, and is refracted while passing through each inner optical pattern nLP. Then, the light is secondarily condensed through the adhesive member OC as well as each inner optical pattern nLP and then is emitted to the base resin BRS.

As shown in Table 2 below, the protective layer CEC has the lowest light transmittance and may have a higher refractive index than that of the adhesive member OC or the inner optical pattern nLP. In addition, the adhesive member OC has a lower refractive index than that of the plurality of inner optical patterns nLP.

TABLE 2

|  | Refractive Index | Optimal Refractive Index |
| --- | --- | --- |
| CEC | 1.5 (Low) | 1.1 (1.5 ↓ or less) |
| Lens | 1.8 (High) | 2.4 (1.8 ↑ or more) |
| Un-GaN | 2.4 ↑ (High) | Same as left |

Accordingly, light that obliquely travels in the lateral direction of the inner optical pattern nLP among the light scattered from the protection layer CEC, i.e., the light passing through the protective layer CEC, may be condensed in the direction of the inner optical pattern nLP and the adhesive member OC in which an angle is reduced. When light travels to the base resin BRS through each inner optical pattern nLP and the adhesive member OC, it may be further refracted to the extent that it is condensed while passing through the boundary between each inner optical pattern nLP, the adhesive member OC, and the base resin BRS.

FIGS. 31(a) to 31(e) are perspective views of various modifications of optical patterns.

Referring to FIGS. 31(a) to 31(e), respective optical patterns LP_2a, LP_2b, LP_2c, LP_2d, and LP_2e and inner optical patterns nLP that are disposed on respective emission areas EA1, EA2, EA3, and EA4 may have an upwardly protruding shape. The optical patterns LP_2a and the inner optical patterns nLP according to an embodiment of FIG. 31(a) may have a converging lens shape protruding in the upper direction and the optical patterns LP_2b and the inner optical patterns according to FIG. 31(b) may have a prism shape. The plurality of optical patterns LP_2b and the inner optical patterns nLP may each extend in the second direction DR2, and may be arranged along the first direction DR1. The optical patterns LP_2c and the inner optical patterns nLP according to FIG. 31(c) may have a hemispherical shape protruding in the upper direction. The optical patterns LP_2d and the inner optical patterns nLP according to FIG. 31(d) may have a hexagonal pyramid shape protruding in the upper direction. The optical patterns LP_2e and the inner optical patterns nLP according to FIG. 31(e) may have a quadrangular pyramid shape protruding in the upper direction.

Figure 32:
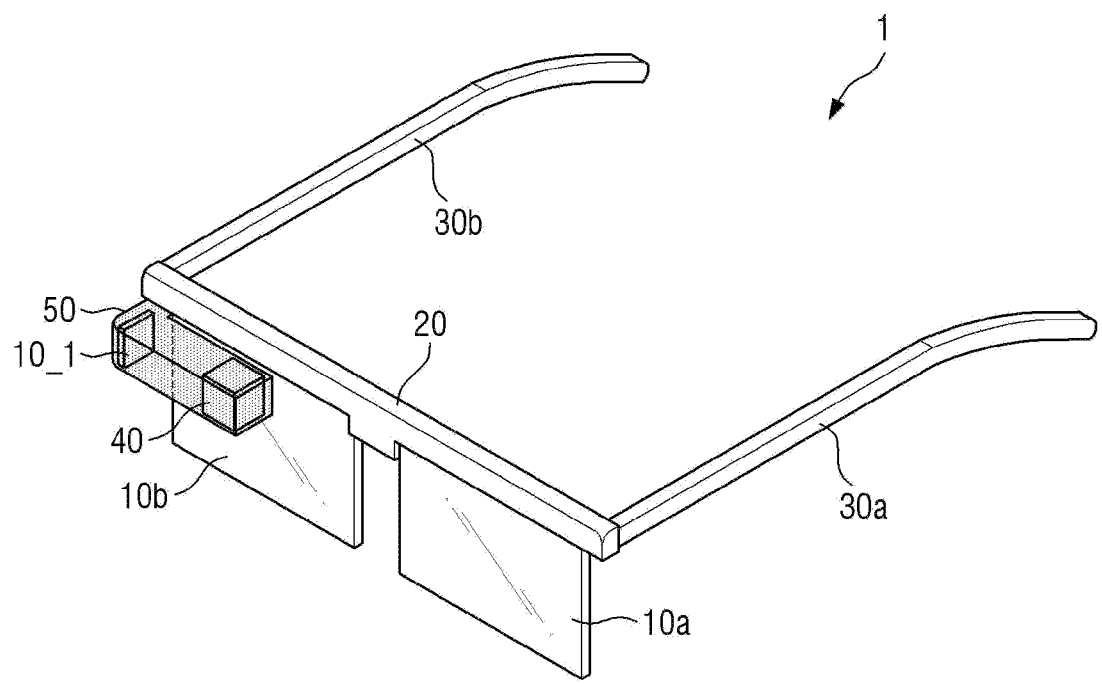
FIG. 32 is an diagram illustrating a virtual reality device including a display device according to one or more embodiments.

FIG. 32 is an diagram illustrating a virtual reality device including a display device according to one or more embodiments.

Referring to FIG. 32, a virtual reality device 1 according to one or more embodiments may be a device in the form of eyeglasses. The virtual reality apparatus 1 according to one or more embodiments includes a display device 10_1, a left eye lens 10a, a right eye lens 10b, a support frame 20, eyeglass temples 30a and 30b, a reflective member 40, and a display device accommodating part 50.

In FIG. 32, the virtual reality device 1 including the eyeglass temples 30a and 30b is illustrated, but the virtual reality apparatus 1 according to an embodiment may be applied to a head mounted display including a head-mounted band allowing the head mounted display to be worn on a head, instead of the eyeglass temples 30a and 30b. That is, the virtual reality device 1 according to one or more embodiments is not limited to that shown in FIG. 32, and may be applied in various other forms to a variety of electronic devices.

The display device accommodating part 50 may include the display device 10_1 and the reflective member 40. An image displayed on the display device 10_1 may be reflected by the reflective member 40 and provided to the user's right eye through the right eye lens 10b. Accordingly, the user may view a virtual reality image displayed on the display device 10_1 with the right eye.

Although FIG. 32 illustrates that the display device accommodating part 50 is disposed at the right end of the support frame 20, embodiments of the present disclosure are not limited thereto. For example, the display device accommodating part 50 may be disposed at the left end of the support frame 20. In this case, the image displayed on the display device 10_1 is reflected by the reflective member 40 and provided to the left eye of the user through the left eye lens 10a. Accordingly, the user may view the virtual reality image displayed on the display device 10_1 with the left eye. Alternatively, the display device accommodating part 50 may be disposed at both the left and right ends of the support frame 20. In this case, the user can view the virtual reality image displayed on the display device 10_1 with both the left and right eyes.

Figure 33:
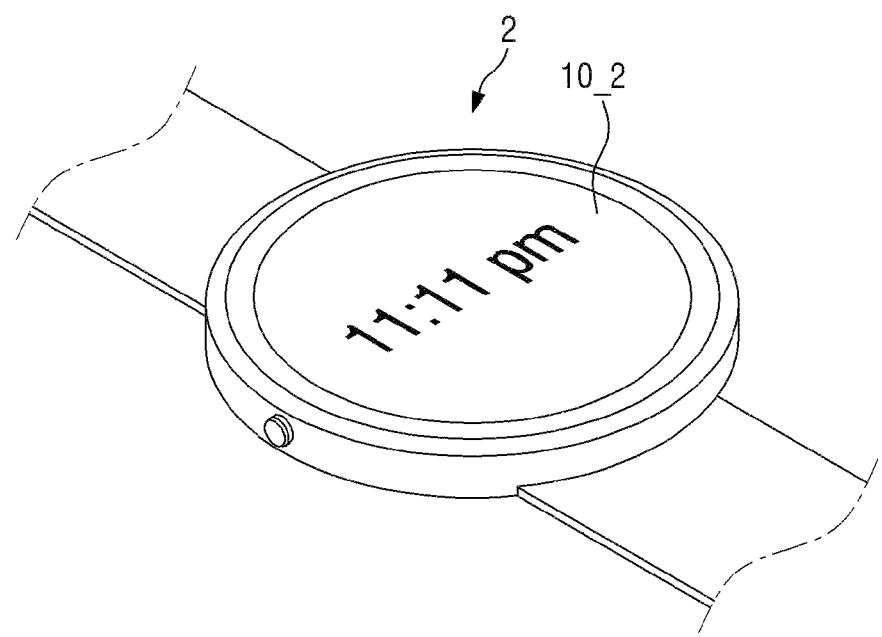
FIG. 33 is a view illustrating a smart device including a display device according to one or more embodiments.

FIG. 33 is a view illustrating a smart device including a display device according to one or more embodiments.

Referring to FIG. 33, a display device 10_2 according to one or more embodiments may be applied to a smart watch 2 that is a smart device.

Figure 34:
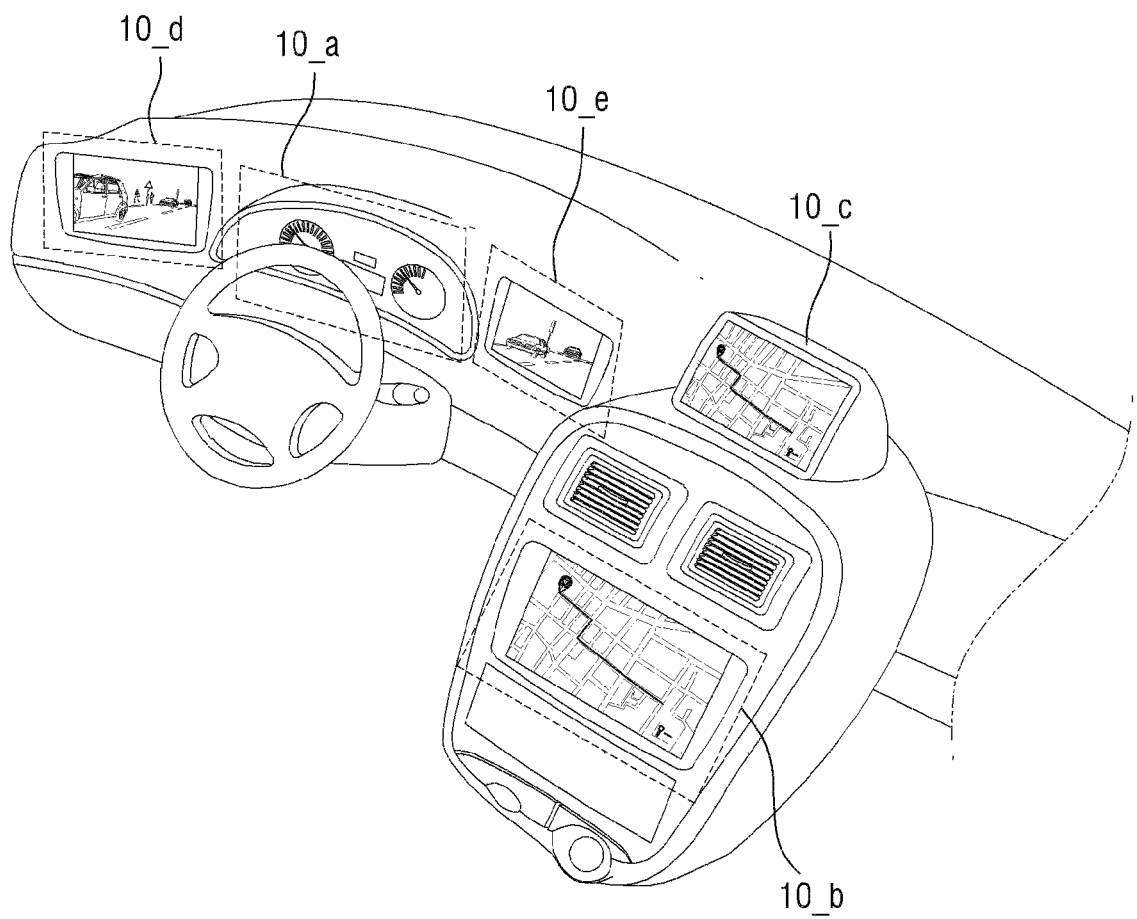
FIG. 34 is a view illustrating a vehicle instrument panel and a center fascia including a display device according to one or more embodiments.

FIG. 34 is an view illustrating a vehicle instrument panel and a center fascia including a display device according to one or more embodiments.

Referring to FIG. 34, a vehicle to which display devices 10_a, 10_b, 10_c, 10_d, and 10_e according to one or more embodiments are applied is illustrated. The display devices 10_a, 10_b, and 10_c according to one or more embodiments may be applied to vehicle instrument panels, center fascia of vehicles, or center information displays (CIDs) disposed on dashboards of vehicles. Alternatively, they may be used as a display device 10_c. Alternatively, the display devices 10_d and 10_e according to one or more embodiments may be applied to a room mirror display that replaces side mirrors of a vehicle.

Figure 35:
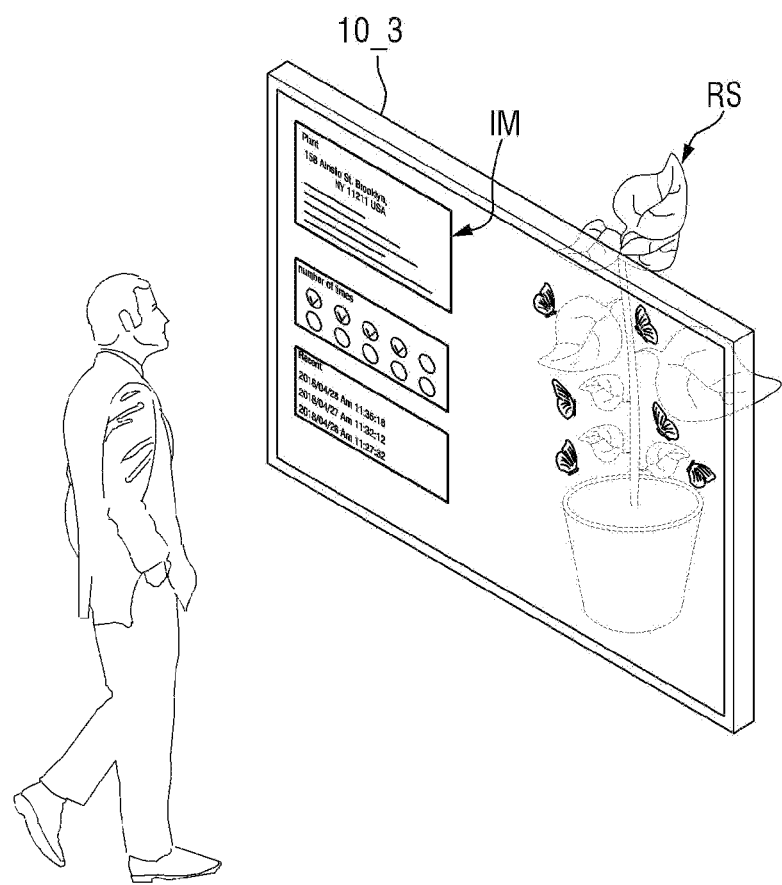
FIG. 35 is a diagram illustrating a transparent display device including a display device according to one or more embodiments.

FIG. 35 is an diagram illustrating a transparent display device including a display device according to one or more embodiments.

Referring to FIG. 35, a display device 10_3 according to one or more embodiments may be applied to a transparent display device. The transparent display device may allow light to be transmitted therethrough, while displaying an image IM. Therefore, a user located in front of the transparent display device may not only view the image IM displayed on the display device 10_3, but may also see an object or background positioned on the rear surface of the transparent display device. When the display device 10_3 is applied to a transparent display device, a first substrate of the display device 10_3 may include a light transmitting portion capable of transmitting light or may be formed of a material capable of transmitting light.

According to embodiments of the present disclosure, the display device may improve emission efficiency of subminiature light emitting diodes.

However, the effects, aspects, and features of embodiments of the present disclosure are not restricted to the one set forth herein. The above and other effects, aspects, and features of embodiments of the present disclosure will become more apparent to one of daily skill in the art to which the embodiments pertain by referencing the claims.

In concluding the detailed description, those skilled in the art will appreciate that many variations and modifications can be made to the embodiments without substantially departing from the principles of the present disclosure. Therefore, embodiments of the present disclosure are used in a generic and descriptive sense only and not for purposes of limitation.

What is claimed is:

1. A display device comprising:
   a partition wall on a substrate;
   a plurality of light emitting elements respectively located on a plurality of emission areas defined by the partition wall, the plurality of light emitting elements extend in a thickness direction of the substrate;
   a base resin located in the plurality of emission areas; and
   a plurality of optical patterns located on at least one of the plurality of emission areas,
   wherein the plurality of emission areas are arranged in a RGBG matrix pattern by the partition wall, wherein from among the plurality of light emitting elements in the RGBG matrix pattern, there are twice as many green (G) light emitting elements as there are blue (B) light emitting elements or red (R) light emitting elements.

2. The display device of claim 1, further comprising:
   a light blocking member on the partition wall; and a filling member covering all of the plurality of emission areas and the plurality of optical patterns located on at least one emission area of the plurality of emission areas, wherein a refractive index of the filling member is greater than a refractive index of the base resin or the plurality of optical patterns.

3. The display device of claim 1, further comprising:

a light blocking member on the partition wall; and an adhesive member covering all of the plurality of emission areas as well as the plurality of optical patterns included in the at least one emission area, wherein a refractive index of the adhesive member is smaller than a refractive index of the base resin or the plurality of optical patterns.

4. The display device of claim 1, wherein:

the plurality of emission areas comprises first to third emission areas, or first to fourth emission areas, that are arranged in the RGBG matrix pattern in each pixel area;

from among the first to fourth emission areas, the first emission area comprises a first light emitting element configured to emit a first light in a wavelength range realizing any one of red, green, and blue colors;

the second emission area comprises a second light emitting element configured to emit a second light in a wavelength range realizing one of red, green, and blue colors, which is different from a color of the first light;

the third emission area comprises a third light emitting element configured to emit a third light in a wavelength range realizing one of red, green, and blue colors, which is different from colors of the first light and the second light; and the fourth emission area comprises a fourth light emitting element configured to emit a fourth light in the same wavelength range as that of any one of the first to third lights.

5. The display device of claim 4, wherein the first to fourth emission areas have the same size or planar area as each other, a distance between the first emission area and the second emission area adjacent to each other in a horizontal direction or in a diagonal direction, a distance between the second emission area and the third emission area, a distance between the first emission area and the third emission area, and a distance between the third emission area and the fourth emission area are equal to one another according to a size or planar area of each of the first to fourth emission areas.

6. The display device of claim 4, wherein sizes or planar areas of the first to fourth emission areas are different from one another, and a distance between the first emission area and the second emission area adjacent to each other in a horizontal direction or in a diagonal direction, a distance between the second emission area and the third emission area, a distance between the first emission area and the third emission area, and a distance between the third emission area and the fourth emission area are the same as or different from one another according to the sizes or planar areas of the first to fourth emission areas.

7. The display device of claim 6, wherein the plurality of optical patterns are the same as or larger than the planar area of each of the first to fourth emission areas so as to fully cover the respective first to fourth emission areas.

8. The display device of claim 6, wherein the plurality of optical patterns are smaller than the planar area of each of the plurality of emission areas, wherein the first to fourth light emitting elements are located at the first to fourth emission areas, respectively.

9. The display device of claim 3, wherein a height or length of the partition wall is the same as a height or length of the plurality of light emitting elements.

10. A display device comprising:

a partition wall in a display area of a substrate and defining first to fourth emission areas in an RGBG matrix pattern in each of pixel areas;

first to fourth light emitting elements respectively located in the first to fourth emission areas;

a plurality of optical patterns located on the first to fourth emission areas respectively comprising the first to fourth light emitting elements, wherein sizes or planar areas of the first to fourth emission areas are the same as or different from one another, and wherein from among the first to fourth light emitting elements in the RGBG matrix pattern, there are twice as many green (G) light emitting elements as there are blue (B) light emitting elements or red (R) light emitting elements.

11. The display device of claim 10, wherein:

the first light emitting element of the first emission area is configured to emit a first light in a wavelength range realizing any one of red, green, and blue colors;

the second light emitting element of the second emission area is configured to emit a second light in a wavelength range realizing one of red, blue, and green colors, which is different from a color of the first light;

the third light emitting element of the third emission area is configured to emit a third light in a wavelength range realizing one of red, blue, and green colors, which is different from colors of the first light and the second light; and the fourth light emitting element of the fourth emission area is configured to emit a fourth light in a wavelength range realizing the same color as the color of any one of the first to third lights.

12. The display device of claim 10, wherein the first and second emission areas in each of the pixel areas are alternately arranged in odd-numbered rows along a first direction that is a horizontal or row direction, the third and fourth emission areas are alternately arranged in even-numbered rows along the first direction, the first and third emission areas are alternately arranged along a first diagonal direction, and the second and fourth emission areas are alternately arranged along the first diagonal direction, the first diagonal direction crossing the first direction and a second direction, the second direction being perpendicular to the first direction.

13. The display device of claim 12, wherein the first and second emission areas located adjacent to each other, the third and fourth emission areas, the first and third emission areas, and the second and fourth emission areas have the same size or planar area as each other, and wherein a distance between the first emission area and the second emission area adjacent to each other in the horizontal direction or in the first diagonal direction, a distance between the second emission area and the third emission area, a distance between the first emission area and the third emission area, and a distance between the third emission area and the fourth emission area are equal to one another.

14. The display device of claim 12, wherein the first and second emission areas located adjacent to each other, the third and fourth emission areas, the first and third emission areas, and the second and fourth emission areas have the same or different sizes or planar areas from each other, and
wherein a distance between the first emission area and the second emission area adjacent to each other in the horizontal direction or in the first diagonal direction, a distance between the second emission area and the third emission area, a distance between the first emission are and the third emission area, and a distance between the third emission area and the fourth emission area are the same as or different from one another according to the sizes or planar areas of the first to fourth emission areas.

15. The display device of claim 12, wherein in the first to fourth emission areas in each of the pixel areas:
a size or area of the first emission area is greater than a size or area of the adjacent second emission area, the size or area of the second emission area is greater than a size or area of the adjacent third emission area, and the third and fourth emission areas adjacent to each other have the same size or area as each other; and
a size or planar area of the first light emitting element is greater than a size or planar area of the second light emitting element corresponding to the areas or sizes of the first to fourth emission areas, the size or planar area of the second light emitting element is greater than the size or planar area of the third light emitting element, and the third and fourth emission areas have the same size or planar area as each other.

16. The display device of claim 15, wherein a size or area of an optical pattern on the first emission area is greater than a size or area of an optical pattern on the second emission area, the size or area of the optical pattern on the second emission area is greater than sizes or areas of optical patterns on the third and fourth emission areas, and the sizes or areas of the optical patterns on the third and fourth emission areas are the same as each other.

17. The display device of claim 12, wherein among the first to fourth emission areas in each of the pixel areas:
a size or area of the first emission area is greater than a size or area of the adjacent second emission area, the size or area of the second emission area is greater than a size or planar area of the adjacent third emission area, and the size or area of the third emission area is greater than a size or area of the adjacent fourth emission area.

18. The display device of claim 17, wherein a size or planar area of the first light emitting element is greater than a size or planar area of the second light emitting element corresponding to the area or size of each of the first to fourth emission areas, the size or planar area of the second light emitting element is greater than a size or planar area of the third light emitting element, and the size or planar area of the third light emitting element is greater than a size or planar area of the fourth light emitting element.

19. The display device of claim 12, wherein among the first to fourth emission areas in each of the pixel areas:
a size or area of the first emission area is greater than a size or area of the second emission area and a sizes or areas of the second to fourth emission areas are the same as one another,
a size or planar area of the first light emitting element is greater than a size or planar area of the second light emitting element corresponding to areas or sizes of the first to fourth emission areas, and sizes or areas of the second to fourth light emitting elements are the same as one another,
wherein the first light emitting element is configured to emit a first light in a wavelength range realizing any one of red, green, and blue colors,
wherein the second light emitting element is configured to emit a second light in a wavelength range realizing one of red, blue, and green colors, which is different from a color of the first light,
wherein the third light emitting element is configured to emit a third light in a wavelength range realizing one of red, blue, and green colors, which is different from colors of the first light and the second light, and
wherein the fourth light emitting element is configured to emit a fourth light in a wavelength range realizing the same color as the color of any one of the first to third lights.

20. An electronic device including a display device,
wherein the display device comprising:
a partition wall on a substrate;
a plurality of light emitting elements respectively located on a plurality of emission areas defined by the partition wall, the plurality of light emitting elements extend in a thickness direction of the substrate;
a base resin located in the plurality of emission areas; and
a plurality of optical patterns located on at least one of the plurality of emission areas,
wherein the plurality of emission areas are arranged in a RGBG matrix pattern by the partition wall, wherein from among the plurality of light emitting elements in the RGBG matrix pattern, there are twice as many green (G) light emitting elements as there are blue (B) light emitting elements or red (R) light emitting elements.

* * * * *